(12) United States Patent
Irie et al.

(10) Patent No.: US 6,724,580 B2
(45) Date of Patent: Apr. 20, 2004

(54) ACTUATOR WITH PIEZOELECTRIC MEMBER

(75) Inventors: Yousuke Irie, Nara (JP); Kazuo Yokoyama, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 245 days.

(21) Appl. No.: 09/782,261

(22) Filed: Feb. 13, 2001

(65) Prior Publication Data

US 2001/0046107 A1 Nov. 29, 2001

(30) Foreign Application Priority Data

Feb. 16, 2000 (JP) .................................... 2000-037801
Feb. 2, 2001 (JP) .................................... 2001-026991

(51) Int. Cl.[7] .................... G11B 21/10; H01L 41/09; H01L 41/047
(52) U.S. Cl. ................ 360/294.4; 310/311; 310/333; 310/366
(58) Field of Search .............. 360/294.4; 310/311, 310/333, 366

(56) References Cited

U.S. PATENT DOCUMENTS 5,335,004 A    8/1994    Matsuhisa
6,327,120 B1 * 12/2001    Koganezawa et al. ... 360/294.4

FOREIGN PATENT DOCUMENTS

| JP | 9-265738 | 10/1997 |
| JP | 10-136665 | 5/1998 |
| JP | 2000-040936 | 2/2000 |

OTHER PUBLICATIONS

"Fabrication of Micro–Pump for INtegrated Chemical Analyzing Systems"; Shoji et al.; Journal of IEICE; C vo. J71–C; pp. 1705–1711, Dec. 1998; with full English translation.

* cited by examiner

Primary Examiner—George J. Letscher
(74) Attorney, Agent, or Firm—Merchant & Gould P.C.

(57) ABSTRACT

An actuator of the present invention includes a shape maintaining sheet, a piezoelectric member provided integrally on the shape maintaining sheet, and a pair of electrodes formed to sandwich the piezoelectric member, wherein the shape maintaining sheet is formed of synthetic resin. Since the piezoelectric member is thin, the stiffness is increased by the shape maintaining sheet made of synthetic resin, and thus resonance frequency can be adjusted.

16 Claims, 25 Drawing Sheets

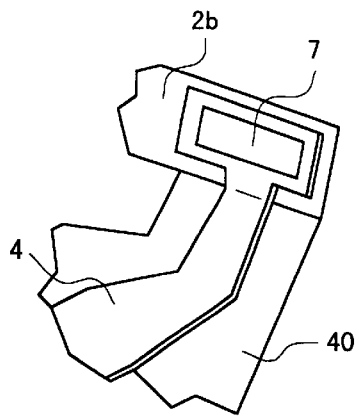
FIG. 22A1
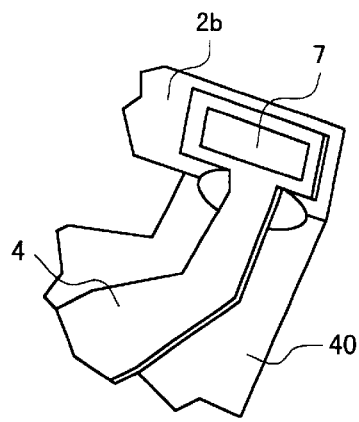
FIG. 22B1
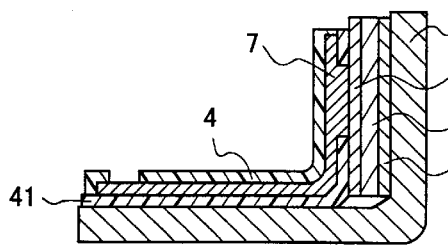
FIG. 22A2
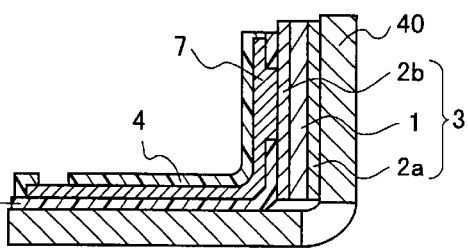
FIG. 22B2
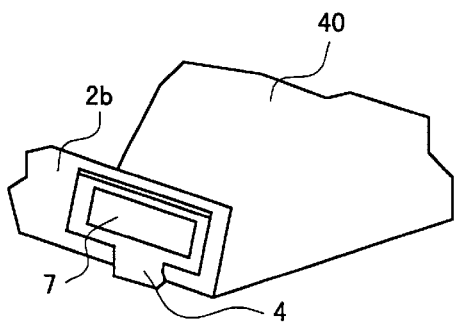
FIG. 22C1
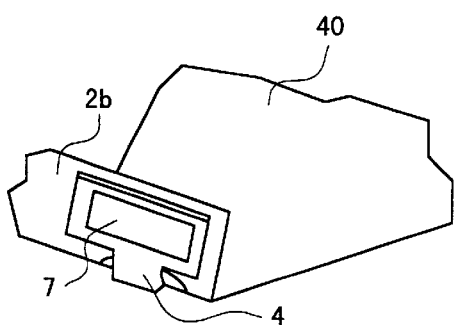
FIG. 22D1
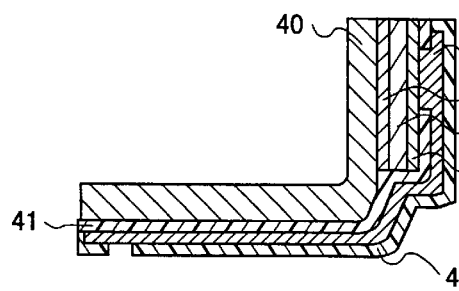
FIG. 22C2
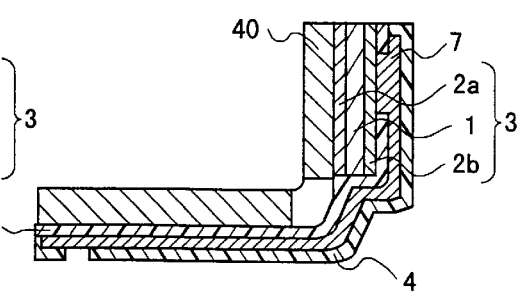
FIG. 22D2

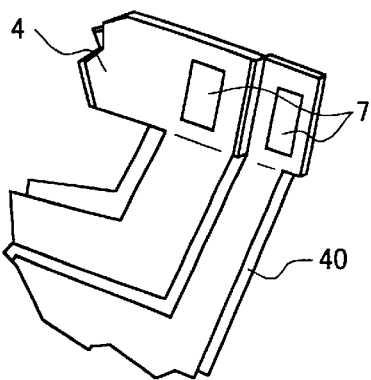
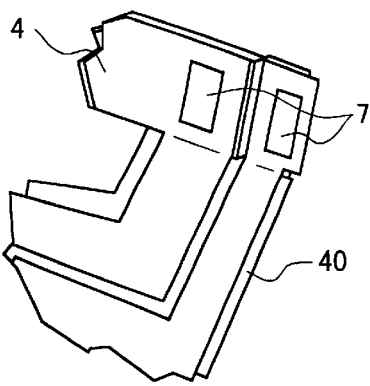
FIG. 23A1         FIG. 23B1
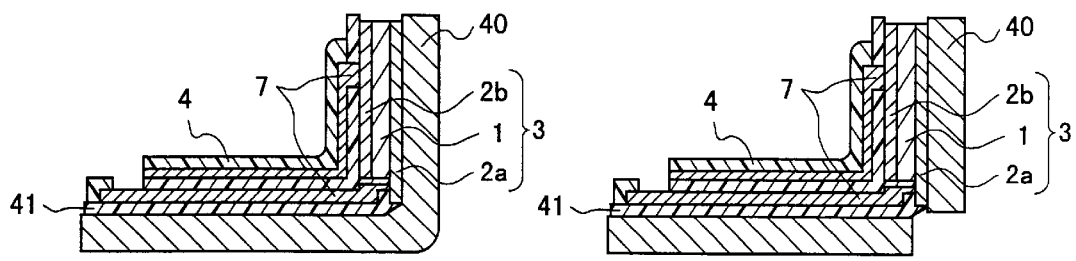
FIG. 23A2         FIG. 23B2
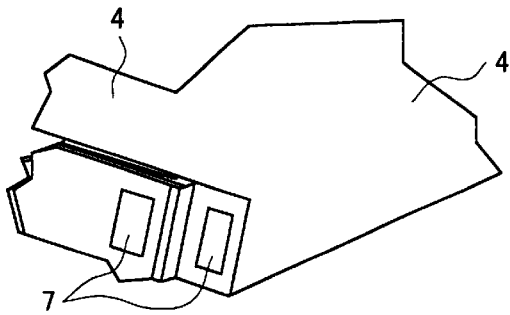
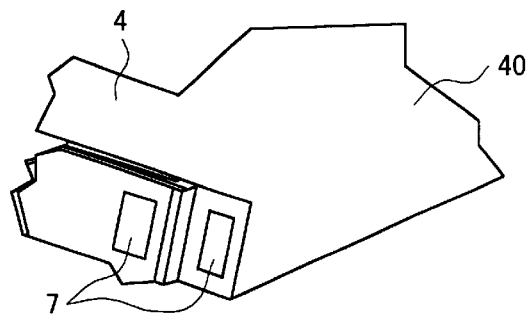
FIG. 23C1         FIG. 23D1
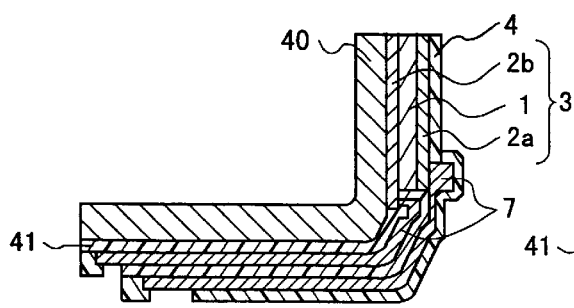
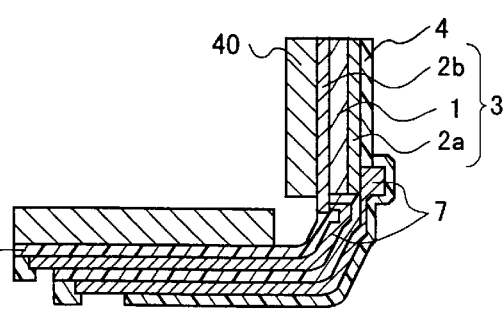
FIG. 23C2         FIG. 23D2

US 6,724,580 B2

ACTUATOR WITH PIEZOELECTRIC MEMBER

BACKGROUND OF THE INVENTION

1. Field of the Invention

The present invention relates generally to an actuator used in various electronic components and a method of manufacturing the same and to an information recording/reproducing device including an actuator.

2. Related Background Art

Devices with piezoelectric elements (piezoelectric microactuators) include micro pumps and a normally closed type micro valve as indicated in "Prototype of Micropump for Integrated Chemical Analysis System" by Shoji et al., IEICE (The Institute of Electronics, Information and Communication Engineers) Transactions (C, vol. J71-C, No.12 (1988), pp.1705–1711). Application examples of longitudinal effect piezoelectric actuators include positioning of a diamond tip in a precision lathe, driving of a needle in a scanning tunneling microscope. It has been discussed to use piezoelectric elements in micromachines, microsensors, or the like through further reduction in size and improvement in performance. In various fields in which the use of such piezoelectric elements has been considered as being impossible, it is expected to enable minute and precise control by the use.

On the other hand, with respect to actuators for HDDs (hard disk drives), it tends to be difficult to position a magnetic head with respect to a track of a medium due to the reduction in track width with the increase in density.

In conventional magnetic disk units, a seek drive of a magnetic head has been carried out using a voice coil motor (VCM) or a rotary VCM.

Based on such a background, two-stage actuators like those recently used in optical disk related devices (such as CD, MO, DVD, or the like) tend to be used in HDDs to increase positioning accuracy.

Generally, systems of the two-stage actuators include an electrostatic system, a piezoelectric system, a magnetostrictive system, and the like.

An example of such two-stage actuators is disclosed in JP 9(1997)-265738 A, which is shown in FIG. 24. In JP 9(1997)-265738 A, it is described that as shown in the figure, a head supporting mechanism (a suspension 25) to which a head slider (not shown in the figure) is fixed vibrates with respect to a coarse actuator (not shown in the figure) in a magnetic disk unit. In JP 9(1997)-265738 A, attention is directed to the increase in track density in a magnetic disk unit. In FIG. 24, a pair of planar piezo elements 23 are incorporated to be positioned on both sides of the rotation center of a head mount block (a mount part 22) as a fixation part where the head supporting mechanism (the suspension 25) to which a head slider is attached is fixed to the coarse actuator. The pair of planar piezo elements are operated differentially to allow the head supporting mechanism (the suspension 25) to shake minutely. Thus, the head slider and a head element fixed to the tip of the head supporting mechanism can be displaced minutely. The planar piezo elements 23 cannot generate a large displacement. However, the suspension 25 is allowed to rotate minutely about a hinge and thus the displacement of the planar piezo elements 23 is increased at the position of the head element by eight times. In JP 9(1997)-265738 A, it is described that the positioning of the coarse actuator and the minute positioning of the head slider and the head element by the minute movement of the head supporting mechanism are operated interconnectedly, and thus the accuracy in positioning of the head element in a track width direction is improved, which enables the track density to increase. It can be assumed easily from FIG. 24 that the suspension 25, the mount part 22, and the planar piezo elements 23 are formed individually and then are assembled to complete the positioning mechanism.

As described above, the piezoelectric elements in the conventional technique had a problem in that generally, the displacement generated thereby and the size thereof are small and the displacement is constrained depending on the configuration, which cause the decrease in displacement and voltage (i.e. efficiency). In addition, fine processing and the use of an adhesive or the like have been difficult in manufacturing processes requiring fine processing of elements with a piezoelectric thin film or the like.

SUMMARY OF THE INVENTION

In order to solve the aforementioned conventional problems, the present invention is intended to provide an actuator and an information recording/reproducing device in which synthetic resin is used as a shape maintaining sheet material, so that the element efficiency and processing precision are improved, and to provide a method of manufacturing the actuator.

In order to achieve the above-mentioned object, an actuator of the present invention includes a shape maintaining sheet, a piezoelectric member provided integrally on the shape maintaining sheet, and a pair of electrodes formed to sandwich the piezoelectric member. The shape maintaining sheet is formed of synthetic resin.

An information recording/reproducing device with an actuator of the present invention includes a slider on which a head is mounted, a head supporting mechanism for supporting the head through the slider, and a tracking member for tracking by the head through the head supporting mechanism. The actuator includes a shape maintaining sheet, a piezoelectric member provided integrally on the shape maintaining sheet, and a pair of electrodes formed to sandwich the piezoelectric member. The shape maintaining sheet is formed of synthetic resin. The head supporting mechanism includes the actuator, and the actuator is driven to displace the head minutely.

A first method of manufacturing an actuator according to the present invention is a method of manufacturing an actuator including a shape maintaining sheet, a piezoelectric member provided integrally on the shape maintaining sheet, and a pair of electrodes formed to sandwich the piezoelectric member, with the shape maintaining sheet being formed of synthetic resin. The first method includes: forming a lower electrode by thin film processing on a substrate processed in a shape of the actuator; forming a piezoelectric thin film; forming an upper electrode; and forming a shape maintaining sheet made of synthetic resin.

A second method of manufacturing an actuator according to the present invention is a method of manufacturing an actuator including a shape maintaining sheet, a piezoelectric member provided integrally on the shape maintaining sheet, and a pair of electrodes formed to sandwich the piezoelectric member, with the shape maintaining sheet being formed of synthetic resin. The second method includes: forming a lower electrode by thin film processing on a substrate; forming a piezoelectric thin film; forming an upper electrode; then processing the substrate, the lower electrode, the piezoelectric thin film, and the upper electrode in a shape of the actuator; and forming a shape maintaining sheet made of synthetic resin.

A third method of manufacturing an actuator according to the present invention is a method of manufacturing an actuator including a shape maintaining sheet, a piezoelectric member provided integrally on the shape maintaining sheet, and a pair of electrodes formed to sandwich the piezoelectric member, with the shape maintaining sheet being formed of synthetic resin. The third method includes: forming a lower electrode, a piezoelectric thin film, and an upper electrode on a substrate; processing them in a shape of the actuator using a lithographic technique; and transferring the lower electrode, the piezoelectric thin film, and the upper electrode onto a pattern formed of synthetic resin.

According to the present invention, the piezoelectric element can be formed using no adhesive and furthermore, a minute element can be obtained and the element can be designed without constraint. In addition, a considerably larger displacement can be obtained as compared to that in a conventional piezoelectric element. Particularly, when the actuator of the present invention is used as one for a magnetic head or the like, it is possible to obtain an actuator and an information recording/reproducing device that can be controlled with high precision. When the resonance frequency is low and a high speed control is difficult, size reduction is required. Even when the size is reduced, the displacement and voltage (i.e. efficiency) can be drawn out efficiently. Furthermore, the reduction in film thickness also enables power consumption to be reduced.

BRIEF DESCRIPTION OF THE DRAWINGS

FIGS. 22A1, 22B1, 22C1, and 22D1 are perspective views showing wiring configurations in a piezoelectric actuator according to Embodiment 5 of the present invention, and FIGS. 22A2, 22B2, 22C2, and 22D2 are sectional views thereof.

FIGS. 23A1, 23B1, 23C1, and 23D1 are perspective views showing wiring configurations in a piezoelectric actuator according to Example 20 of the present invention, and FIGS. 23A2, 23B2, 23C2, and 23D2 are sectional views thereof.

DETAILED DESCRIPTION OF THE INVENTION

Figure 1A:
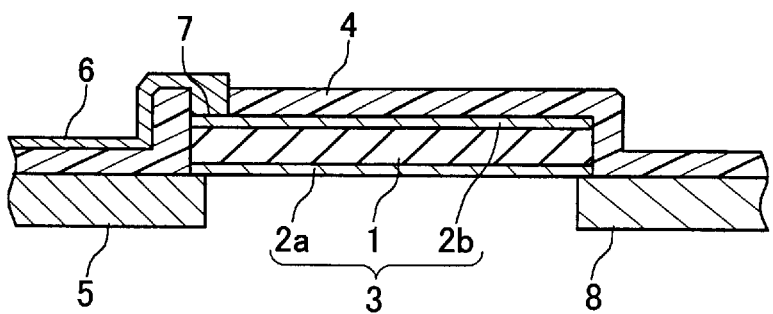
FIGS. 1A to 1G are explanatory sectional views showing basic configurations of actuator mechanisms according to Embodiment 1 of the present invention.

The aforementioned problems are solved by using the following in an actuator with a piezoelectric thin film, an actuator mechanism, and an information recording/reproducing device according to the present invention. The basic configuration of the actuator mechanism includes a piezoelectric thin film, a pair of electrodes formed to sandwich the piezoelectric thin film, a shape maintaining sheet for supporting the thin film, and a fixation material required for the actuator mechanism to function as a device.

Particularly, a plastic material of synthetic resin is used for the shape maintaining sheet. When this configuration is employed, the shape maintaining sheet for supporting the piezoelectric thin film can be formed to have flexibility. Therefore, it also is possible to increase real displacement. When the mechanical strength is low for a device, a thin metal or oxide film is inserted, as a reinforcer, between the electrodes formed to sandwich the piezoelectric thin film and the shape maintaining sheet, on the outer side of the shape maintaining sheet (i.e. on the surface of the shape maintaining sheet on which the piezoelectric thin film is not formed), or on the electrode on which the shape maintaining sheet is not formed. The thickness of the synthetic resin forming the shape maintaining sheet may be increased, or the actuator mechanism may be formed so that the piezoelectric element is covered with synthetic resin from both sides.

When a sufficient mechanical strength still cannot be obtained, another component may be provided for the driving part formed of the piezoelectric element so as to reinforce the part lacking strength. In this manner, parts to operate as an actuator and parts to be used for increasing mechanical strength are formed separately and then are combined.

The electrodes and leads thereof are led out through a through hole formed in the synthetic resin forming the shape maintaining sheet. Such a configuration enables flexure of the piezoelectric thin film in its thickness direction to be used as driving means.

Such an actuator mechanism is produced using a lithographic technique and therefore a minute configuration can be obtained, and it can be handled individually as a single device due to the application of the synthetic resin. Therefore, a complicated structure can be produced. For instance, a simple combination of single elements such as a bimorph structure, a layered structure, a driving composite structure, or the like allows piezoelectric elements with various two or three dimensional configurations to be obtained. When the piezoelectric element is fixed to a fixation member, it functions as an actuator.

The piezoelectric elements with the above-mentioned configuration are means used when piezoelectric elements with most simple configurations are produced and then are combined to obtain various configurations. When element parts are produced using the lithographic technique and at least two element parts are combined, to which synthetic resin is applied, it also is possible to form a piezoelectric element integrally, in which the above-mentioned configuration or the composition of respective single elements are utilized for driving.

The following description is directed to solutions of the aforementioned problems in the actuator mechanism when it is applied to an actuator for a hard disk drive or the like.

In order to solve the problem in that the improvement in positioning accuracy is required, a configuration is employed in which a slider supporting a head element is rotated and driven by a displacement reducing mechanism using an actuator capable of obtaining large movements, as a driving force. In the above, the "actuator capable of obtaining large movements" denotes the above-mentioned actuator with the configuration including synthetic resin.

Specifically, at least two driving elements of the actuator are positioned in places corresponding to the midpoint between the suspension and the slider of the head supporting mechanism so that the driving elements are in plane symmetry with respect to a plane that is perpendicular to a disk surface and is along the longitudinal centerline of a suspension.

When a disk is rotated, the slider floats up in the air by several tens of nanometers due to the air pressure caused by the rotation. In this case, an air viscous frictional force (frictional force caused by the phenomenon that the slider is pulled in the disk rotation direction) of about several millinewtons is caused between the slider and the disk as the disk is rotated faster. When the slider is pulled in the disk rotation direction by the viscous frictional force and the suspension having driving elements of minute auxiliary driving means has low stiffness, the suspension also is pulled in the disk rotation direction. As a result, the flying height of the slider becomes unstable, and it becomes impossible to control the minute auxiliary driving means. Therefore, in view of the stiffness of the suspension and the controllability of the minute auxiliary driving means, the respective driving elements are positioned to define an angle of at least 15 degrees with respect to the plane that is perpendicular to the disk surface and is along the longitudinal centerline of the suspension. Voltages in phases opposite to each other are applied to the driving elements, respectively, to operate the driving elements, and thereby the head supporting mechanism to which the slider is attached is rotated. Thus, the slider on which the head element is formed is allowed to rotate in a direction parallel to the disk surface and highly accurate positioning can be achieved. In such a configuration, since the shape maintaining sheet for the driving elements is formed of a flexible material, the mechanical strength is lowered in the flexure direction and in the direction perpendicular to the disk surface in the piezoelectric element.

When the piezoelectric element part has a low mechanical strength, as described above, a thin metal film, a thin oxide film, or the like may be inserted, as a reinforcer, between the electrodes formed to sandwich the piezoelectric thin film and the shape maintaining sheet, on the outer side of the shape maintaining sheet (i.e. on the surface of the shape maintaining sheet on which the piezoelectric thin film is not formed), or on the electrode on which the shape maintaining sheet is not formed. The thickness of the synthetic resin forming the shape maintaining sheet may be increased, or the piezoelectric element part may be formed so that the piezoelectric element is covered with synthetic resin from both sides.

When a sufficient mechanical strength still cannot be obtained, another component may be provided for the driving part formed of the piezoelectric element so as to reinforce the part lacking strength. In this manner, parts to operate as an actuator and parts to be used for increasing mechanical strength are formed separately and then are combined. This allows a driving displacement to be increased without decreasing the mechanical strength.

In an actuator mechanism with another configuration, at least two driving elements (piezoelectric elements) included in an actuator are positioned in places corresponding to the midpoint between a suspension and a slider of a head supporting mechanism so as to be parallel to a disk surface. The actuator mechanism has a configuration with center impeller type beams and one opening is provided, so that fixation parts, a movable part, and at least two beams connecting them are formed integrally. An electrode layer (not shown in the figure) is provided to form a displacement generation part in at least a part of at least one beam so as to allow expansion and contraction in the direction extending between the fixation parts and the movable part (flexure in the thickness direction) to be caused. The actuator mechanism is constructed so that the displacement of the movable part with respect to the fixation parts, which is caused by the expansion and contraction (flexure in the thickness direction) in the displacement generation part, is an arcuate or rotational displacement in a plane of the sheet like body. Particularly, the shape maintaining sheet for the piezoelectric element in the driving part is produced using at least synthetic resin to be provided with high flexibility and thus a large displacement is obtained. Specifically, the piezoelectric elements are positioned in places corresponding to the midpoint between the suspension and the slider of the head supporting mechanism, and one of the fixation parts is fixed to the suspension and the other to the slider.

In this configuration, the piezoelectric elements have a low mechanical strength particularly in the direction perpendicular to the disk surface (in the gravity direction) and in addition, the slider is supported by the actuator. Therefore, a considerably high mechanical strength is required in this direction. When the piezoelectric element part has a low mechanical strength, as described above, a thin metal film, a thin oxide film, or the like is inserted, as a reinforcer, between the electrodes formed to sandwich the piezoelectric thin film and the shape maintaining sheet, on the outer side of the shape maintaining sheet (i.e. on the surface of the shape maintaining sheet on which the piezoelectric thin film is not formed), or on the electrode on which the shape maintaining sheet is not formed. The thickness of the synthetic resin forming the shape maintaining sheet may be increased, or the piezoelectric element part may be formed so that the piezoelectric element is covered with synthetic resin from both sides.

When a sufficient mechanical strength still cannot be obtained, another component may be provided for the driving part formed of the piezoelectric elements so as to reinforce the part lacking strength. In this manner, parts to operate as an actuator and parts to be used for increasing mechanical strength are formed separately and then are combined.

In the case where sufficient torque cannot be obtained during a driving operation, actuators with such a configuration can be combined to produce a layered structure, a driving composite structure, or the like. Thus, actuators having piezoelectric thin films with various configurations employing two or three dimensional structures can be obtained.

In addition, the configuration of the actuator mechanism can be designed without much consideration to the interrelationship between the mechanical strength and the displacement.

The following description is directed to solutions of the problems in that the displacement is constrained depending on the configuration and the displacement and voltage (i.e. efficiency) are decreased.

When the actuator mechanism is constructed so that the direction in which the driving elements in the actuator part are driven is substantially parallel to the direction in which the slider on which the head element is formed is displaced, the displacement generated by the driving elements can be transmitted efficiently to the slider provided with the head element. Generally, the driving displacement and the stiffness (mechanical strength) are inversely proportional to each other. When it is intended to increase the driving displacement, the stiffness must be lowered, and on the other hand, the improvement in the stiffness causes the reduction in driving displacement. A main reason for this is that a member for supporting the slider against gravity, a stiff member resistant to the viscous frictional force caused by the rotation of the disk, and a stiff member resistant to inertial force when the main driving part comes to stop from a driving state are formed together with the member of the driving part for generating the displacement, as one member. Therefore, when the piezoelectric element part is formed as a device that can be handled individually, it can be combined with other stiff members. Consequently, an actuator providing a large driving displacement can be obtained even when having high stiffness.

Particularly, when the shape maintaining sheet in the piezoelectric element part is formed using at least synthetic resin, the piezoelectric element part has high flexibility. Therefore, the loss caused by the constraint in a driving operation is absorbed by the part. Thus, it is possible to minimize the reduction in displacement.

Figure 24:
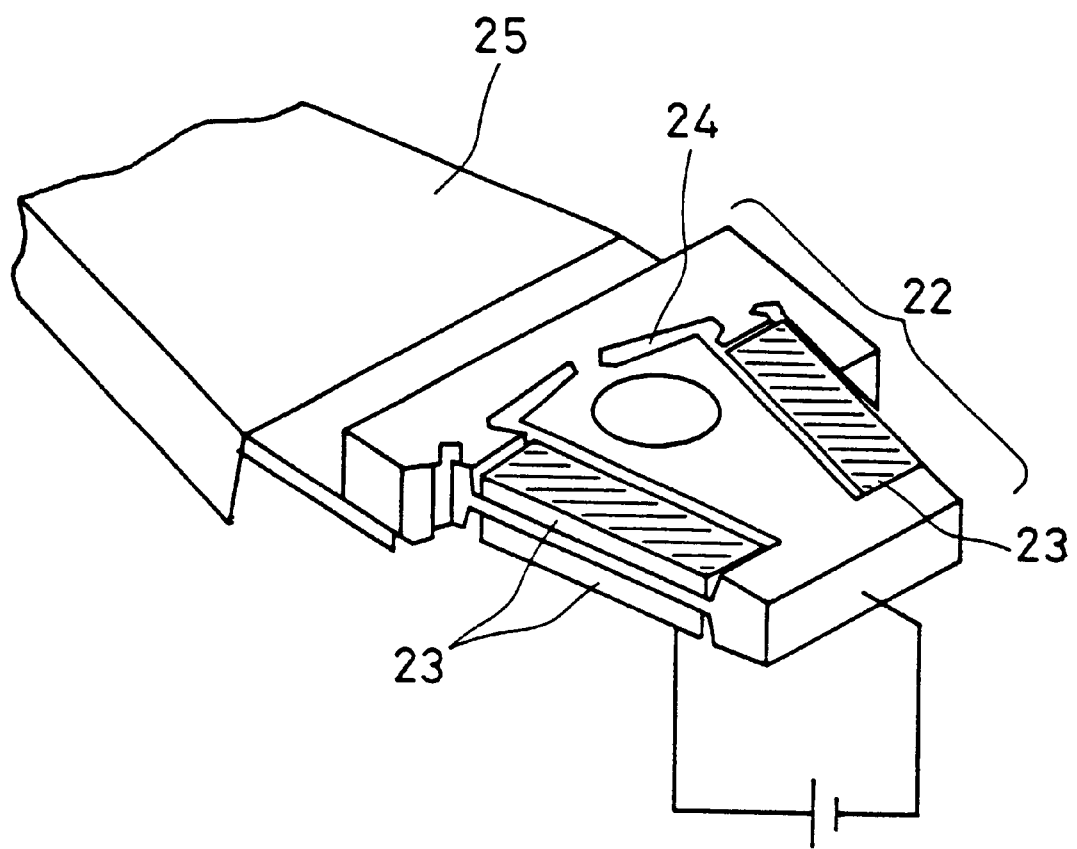
FIG. 24 is an explanatory view showing a conventional actuator.

The problems of low resonance frequency and difficulty in high speed control can be solved by using the above-mentioned configuration. Since a sufficient displacement and voltage can be obtained even when the driving elements are smaller than those in the conventional example shown in FIG. 24, the resonance frequency can be set to be high and highly accurate high-speed control is possible.

Furthermore, when parts other than the shape maintaining sheet part also are coated with synthetic resin, it is possible to suppress the resonance.

With respect to the problems of the high driving voltage affecting power consumption and the head element, when the above-mentioned configuration is used and a piezoelectric material is used for forming a thin film, a sufficient displacement and voltage (about 1 $\mu$m and ±3 to 5V, respectively) can be obtained, and therefore the power consumption can be lowered and the influence on the head element also can be reduced as compared to those in the conventional example.

In addition, since the thin film is used, thin film processing and a lithographic technique can be employed, and this processing enables electrodes and wiring to be formed simultaneously.

The wiring used for driving the piezoelectric element is formed at the same time the piezoelectric thin film of the element part is processed using the lithographic technique. After the processing of the piezoelectric thin film in a predetermined shape, synthetic resin is applied thereto and then is patterned so as to be used as a shape maintaining sheet, a protective layer, or an insulating layer for the element. The synthetic resin is baked to be cured, and then a plating resist is applied and patterned. Using the pattern, conductor plating is carried out and thus a wiring is formed. After the plating resist is removed, synthetic resin is applied to form a cover, is patterned, and then is cured. When such a configuration is used in which the wiring is interposed between synthetic resin layers and synthetic resin is used for a protective layer or a substrate for the piezoelectric element, the shape of the piezoelectric element is maintained even when the substrate on which the piezoelectric element is formed is removed from the piezoelectric element, since the synthetic resin replaces the shape maintaining sheet, a protective member, or the substrate for the piezoelectric thin film (piezoelectric element). Furthermore, since the wiring also is formed at the same time the piezoelectric thin film is processed, the driving element can be handled as a single device and can be operated individually. In addition, the driving element also can be used while being attached to another member or the like using an adhesive or the like.

When the wiring portion is formed to have a structure including at least synthetic resin/a conductor (a wiring material)/synthetic resin, a flexible wiring structure can be obtained. This structure enables the wiring to be led out from not only the same plane as that in which the piezoelectric element is formed but also the other plane.

Moreover, when the substrate on which the piezoelectric element is formed is made of a flexible material such as metal, for example, stainless steel, or a member attached to the piezoelectric element or the like has flexibility, it also is possible to lead out the wiring even in a three dimensional structure obtained by bending the piezoelectric element together with the substrate.

The following description is directed to manufacturing methods. Since the manufacturing process differs depending on the processed state of a substrate used for the manufacture of the piezoelectric thin film, the manufacturing methods using different substrates are described separately.

Processed Substrate

When a substrate is preprocessed in an actuator shape, a piezoelectric thin film is formed directly on the substrate by sputtering or the like. The film structure includes a lower electrode, a piezoelectric thin film, and an upper electrode (hereinafter this structure is referred to as a "piezoelectric element"). In this case, the piezoelectric thin film and the lower and upper electrodes thus formed may be patterned using a metal mask or the like during their formation, or they may be processed by dry etching or wet etching using a lithographic technique after their formation.

After the processing of the element, the wiring is formed. When the substrate is made of a conductive material, the lower electrode is led out through the substrate since it is in contact with the substrate. On the other hand, for the upper electrode, synthetic resin is applied as a base to be an insulating layer and is patterned in a shape allowing the wiring to be led out, which then is cured. A through hole is formed in a portion of the synthetic resin as the base positioned on the upper electrode so that conductivity with the upper electrode of the piezoelectric element is achieved. A seed layer Cr/Cu for copper plating is sputtered on the synthetic resin as the base of the insulating layer, and then a pattern for the copper plating is formed using a resist. Using this pattern, a copper plating layer is formed by electroplating to have a thickness of about 2 to 10 $\mu$m. After the removal of the plating resist, synthetic resin is applied to form a cover, is patterned, and then is cured.

When the substrate is not made of a conductive material, the piezoelectric thin film and the upper electrode are processed so that parts of them positioned on the lower electrode are removed, and thus the lower electrode is led out through the parts where the upper electrode and the piezoelectric thin film have been removed. Then, synthetic resin is applied on the element, is patterned, and then is cured. In this step, a through hole also is formed for leading out the lower and upper electrodes. A seed layer Cr/Cu for copper plating is sputtered on the synthetic resin as the base of the insulating layer, and then a pattern for the copper plating is formed using a resist. Using this pattern, a copper plating layer is formed by electroplating to have a thickness of about 2 to 10 $\mu$m. After the removal of the plating resist, synthetic resin is applied to form a cover, is patterned, and then is cured.

Subsequently, the substrate is processed. Methods of processing the substrate are divided into a partial process in which the shape maintaining sheet part in the piezoelectric element part is processed and a whole process in which the whole substrate is processed. In the partial process, synthetic resin for substrate processing is applied on both sides excluding the vicinity of the shape maintaining sheet part on the side to be processed, by a spinner method (using a spin coater), a roll method, a dipping method, a spray method, an ink jet method, or the like. Preferably, a suitable application method is employed depending on the case, for instance, the dipping or roll method may be used when the film thickness is not required to be controlled precisely, and the spinner or spray method may be used when the film thickness should be controlled. When the application material is to be applied efficiently or is to be applied partially, preferably the ink jet method is used.

As the method of partially removing the synthetic resin for patterning the synthetic resin to be used for the substrate processing, for example, synthetic resin may be removed partially using a patterning technique such as exposure to light, development, or the like when having photosensitivity, or may be removed partially by laser processing. Any methods may be used as long as the synthetic resin on a portion of the substrate to be processed can be removed.

Afterward, the portion of the substrate not coated with the synthetic resin is processed by wet etching.

The processing methods include a half etching method in which a substrate is processed to be removed partially so as to have a certain thickness and a method of removing the whole substrate. Either of them may be used depending on the stiffness and displacement required.

The following description is directed not to a partial etching but to the method of removing the whole substrate by etching. Initially, a piezoelectric element is formed on a substrate surface and then synthetic resin is applied thereto. The steps up to this stage are the same as in the above-mentioned partial processing. Then, the whole substrate is removed by etching. When the whole substrate is removed, a Pt layer of the lower electrode serves as an etching stopper preventing further etching by an etchant. Thus, the piezoelectric element is transferred from the substrate onto the synthetic resin layer formed of synthetic resin. The synthetic resin has a relatively high adhesiveness and therefore, the use of such a processing method enables the piezoelectric element to be transferred easily without using an adhesive. When the wiring described above also is formed in this step, the wiring can be led out easily and the piezoelectric element can be handled as a single device. In addition, it also becomes possible to lead out the wiring from the other side than that on which the piezoelectric thin film is formed and to form a three dimensional structure or the like.

In the above, the manufacturing methods were described briefly, but an important aspect is that the piezoelectric element part including the side faces of the piezoelectric element is covered with synthetic resin so as not to be damaged when the substrate is etched. Usually, the substrate on which the piezoelectric thin film is formed is thicker than the piezoelectric thin film and therefore, the wet etching is used in general. Since a strongly acidic or alkaline etchant is used as the etchant and the piezoelectric thin film also can be etched with such an etchant, the piezoelectric element is required to be covered with synthetic resin. The electrodes and wiring for driving the piezoelectric element are patterned to be formed using a lithographic technique before the etching of the substrate. In this case, the synthetic resin also is used as an insulating layer, which enables the driving wiring to be formed integrally. In the above, the manufacturing methods using a processed substrate were described briefly. In such a case, the patterned shape essentially is determined by the shape of the processed substrate.

For the wiring formation, synthetic resin is applied to the piezoelectric element, and a through hole is formed in portions of the lower and upper electrodes when the synthetic resin is patterned. The electrodes are led out using the through hole and thus a wiring part is formed. As the method of forming the electrodes, films may be formed with an electrode material such as Pt, Au, or the like by sputtering, vacuum deposition, or the like, and then may be processed to have wiring pattern shapes, or they may be formed by plating or the like.

When the element part does not have sufficient stiffness, a gold film, an oxide film, or the like may be formed to have a thickness of several microns as a reinforcer when the piezoelectric element is formed, or may be formed by plating. Alternatively, the thickness of the synthetic resin may be increased.

Non-Processed Substrate

The following description is directed to manufacturing methods using a substrate that is not preprocessed in an actuator shape.

Manufacturing methods employed when using a non-processed substrate include the following two methods. One manufacturing method includes forming a piezoelectric element, processing it, processing the substrate in an actuator shape, and then allowing the whole or part of the substrate to remain. The other manufacturing method includes forming the piezoelectric element, processing it, processing the substrate in an actuator shape, and then removing the whole substrate.

First, the case where the whole substrate is removed is described. A piezoelectric element part (with a structure including a lower electrode/a piezoelectric thin film/an upper electrode) is formed and is processed. After the processing of the element, wiring is formed. When the substrate is made of a conductive material, the lower electrode is led out through the substrate since it is in contact with the substrate. On the other hand, for the upper electrode, synthetic resin is applied as a base to be an insulating layer and is patterned in a shape allowing the wiring to be led out, which then is cured. A through hole is formed in a portion of the synthetic resin as the base positioned on the upper electrode so that conductivity with the upper electrode of the piezoelectric element is achieved. A seed layer Cr/Cu for copper plating is sputtered on the synthetic resin as the base of the insulating layer, and then a pattern for the copper plating is formed using a resist. Using this pattern, a copper plating layer is formed by electroplating to have a thickness of about 2 to 10 $\mu$m. After the removal of the plating resist, synthetic resin is applied to form a cover, is patterned, and then is cured.

When the substrate is not made of a conductive material, the piezoelectric thin film and the upper electrode are processed so that parts of them positioned on the lower electrode are removed, and thus the lower electrode is led out through the parts where the upper electrode and the piezoelectric thin film have been removed. Then, synthetic resin is applied on the element, is patterned, and then is cured. In this step, a through hole also is formed for leading out the lower and upper electrodes. A seed layer Cr/Cu for copper plating is sputtered on the synthetic resin as the base of the insulating layer, and then a pattern for the copper plating is formed using a resist. Using this pattern, a copper plating layer is formed by electroplating to have a thickness of about 2 to 10 $\mu$m. After the removal of the plating resist, synthetic resin is applied to form a cover, is patterned, and then is cured.

Subsequently, the substrate is processed. When the whole substrate is to be removed, after the piezoelectric element is formed on the substrate, synthetic resin for substrate processing is applied thereto by a spinner method (using a spin coater), a roll method, a dipping method, a spray method, an ink jet method, or the like. As the method of partially removing synthetic resin for patterning the synthetic resin to be used for the substrate processing, for example, the synthetic resin may be removed partially using a lithographic patterning technique such as exposure to light, development, or the like when having photosensitivity, or may be removed partially by laser processing. Any methods may be used as long as the synthetic resin on a portion of the substrate to be processed can be removed. In this case, when the manufacturing method using a lithographic technique is used, the piezoelectric element can be positioned without constraint while being processed, and the actuator shape can be formed without constraint while the synthetic resin is patterned. Therefore, it is possible to produce complicated shapes and various structures. When the wiring described above also is formed in this step, the wiring can be led out easily and the piezoelectric element can be handled as a single device. In addition, it also becomes possible to lead out the wiring from the side other than that on which the piezoelectric thin film is formed and to form a three dimensional structure or the like.

Then, the portion of the substrate which is not coated with the synthetic resin is processed by wet etching or the like, i.e. the whole substrate is removed. When the whole substrate is removed, a Pt layer of the lower electrode serves as an etching stopper preventing the etching by an etchant. Thus, the piezoelectric element is transferred from the substrate onto the synthetic resin layer formed of synthetic resin. The synthetic resin has a relatively high adhesiveness and therefore the use of such a processing method enables the piezoelectric element to be transferred easily without using an adhesive. Particularly, when a resin containing polyimide is baked, high adhesiveness with respect to a diaphragm can be obtained.

In the above, the manufacturing methods were described briefly, but an important aspect is that the piezoelectric element part including the side faces of the piezoelectric element is covered with synthetic resin so as not to be damaged when the substrate is etched. Usually, the substrate on which the piezoelectric thin film is formed is thicker than the piezoelectric thin film and therefore, the wet etching is used in general. Since a strongly acidic or alkaline etchant is used as the etchant and the piezoelectric thin film also can be etched by such an etchant, the piezoelectric element is required to be covered with synthetic resin. The electrodes and wiring for driving the piezoelectric element are patterned to be formed using a lithographic technique before the etching of the substrate. In this case, the synthetic resin also is used as an insulating layer, which enables the driving wiring to be formed integrally.

Next, the manufacturing method in which the substrate is allowed to remain is described.

There are two methods for allowing the substrate to remain. One is a method in which the whole substrate is allowed to remain in a patterned shape, and the other is a method in which the thickness of the substrate to remain is changed.

In the method of allowing the whole substrate to remain in a patterned shape, a piezoelectric element part (with a structure including a lower electrode/a piezoelectric thin film/an upper electrode) is formed and is processed. After the processing of the element, wiring is formed. When the substrate is made of a conductive material, the lower electrode is led out through the substrate since it is in contact with the substrate. On the other hand, for the upper electrode, synthetic resin is applied as a base to be an insulating layer and is patterned in a shape allowing the wiring to be led out, which then is cured. A through hole is formed in a portion of the synthetic resin as the base positioned on the upper electrode so that conductivity with the upper electrode of the piezoelectric element is achieved. A seed layer Cr/Cu for copper plating is sputtered on the synthetic resin as the base of the insulating layer, and then a pattern for the copper plating is formed using a resist. Using this pattern, a copper plating layer is formed by electroplating to have a thickness of about 2 to 10 $\mu$m. After the removal of the plating resist, synthetic resin is applied to form a cover, is patterned, and then is cured.

When the substrate is not made of a conductive material, the piezoelectric thin film and the upper electrode are processed so that parts of them on the lower electrode are removed, and thus the lower electrode is led out through the parts where the upper electrode and the piezoelectric thin film have been removed. Then, synthetic resin is applied on the element, is patterned, and then is cured. In this step, a through hole also is formed for leading out the lower and upper electrodes. A seed layer Cr/Cu for copper plating is sputtered on the synthetic resin as the base of the insulating layer, and then a pattern for the copper plating is formed using a resist. Using this pattern, a copper plating layer is formed by electroplating to have a thickness of about 2 to 10 $\mu$m. After the removal of the plating resist, synthetic resin is applied to form a cover, is patterned, and then is cured.

Subsequently, the substrate is processed. After the piezoelectric element is formed on the substrate, synthetic resin for substrate processing is applied thereto by a spinner method (using a spin coater), a roll method, a dipping method, a spray method, an ink jet method, or the like. As the method of partially removing synthetic resin for patterning the synthetic resin to be used for the substrate processing, for example, synthetic resin may be removed partially using a lithographic patterning technique such as exposure to light, development, and the like when having photosensitivity, or may be removed partially by laser processing. Any methods may be used as long as the synthetic resin on a portion of the substrate to be processed can be removed. Then, the portion of the substrate which is not coated with the synthetic resin is processed by wet etching. In this case, since the synthetic resin is applied to only one surface, the other surface on which no synthetic resin is applied should be prevented from coming into direct contact with an etchant or the like by being provided with a protective tape or film put thereon. When the substrate is intended to be etched at a high speed and with high precision, synthetic resin also is applied to the opposite side to that on which the piezoelectric element is formed, patterns are formed on both surfaces using a two-side exposure device or the like, and the both surfaces are etched.

In the method of changing the thickness of the substrate as the other method, the production of a piezoelectric element, wiring formation, methods of applying synthetic resin and etching a substrate are the same as in the above. Then, the synthetic resin on the side on which the piezoelectric element is not formed is removed and the substrate is etched again by wet etching or the like until the substrate with a desired thickness is obtained. When the thickness is intended to be varied partially, a pattern is formed newly with synthetic resin and then the substrate may be etched using the pattern.

In the above, the manufacturing methods were described briefly, but an important aspect is that the piezoelectric element part including the side faces of the piezoelectric element is covered with synthetic resin so as not to be damaged when the substrate is etched. Usually, the substrate on which the piezoelectric thin film is formed is thicker than the piezoelectric thin film and therefore, the wet etching is used in general. Since a strongly acidic or alkaline etchant is used as the etchant and the piezoelectric thin film also can be etched by such an etchant, the piezoelectric element is required to be covered with synthetic resin. The electrodes and wiring for driving the piezoelectric element are patterned to be formed using a lithographic technique before the etching of the substrate. In this case, the synthetic resin also is used as an insulating layer, which enables the driving wiring to be formed integrally. In addition, it also becomes possible to lead out the wiring from the side other than that on which the piezoelectric thin film is formed and to form a three dimensional structure or the like.

Synthetic Resin

Organic synthetic resins further are divided into plastic (including thermoplastic resin, thermosetting resin, and plastic secondary products (films, sheets, various foams, adhesives, and paints)), synthetic fiber (nylon, polyester, acrylic fibers, etc.), synthetic rubber (diene-based or non-diene-based synthetic rubber, thermoplastic elastomer, etc.), and others (high water absorption resin, synthetic paper, artificial leather, ion-exchange resin, ion-exchange membrane, biodegradable polymer, etc.).

Among them, particularly desirable synthetic resins are those classified as plastic. For instance, synthetic resins classified as plastic include those in a form of thermoplastic resin, thermosetting resin, and plastic secondary products. Specific examples include, as a resist, a photo resist (diazonaphthoquinone-novolac resin, polymethyl methacrylate, copolymers containing methyl methacrylate, polymethyl isopolopenillicketone, a cyclized polyisoprene-azido compound resist, a phenol resin-azido compound resist, a principal chain breaking-type electron beam positive resist, a dissolution suppressing electron beam resist, a cross-linking type electron beam negative resist, an epoxy negative electron beam resist, a polyethylene negative electron beam resist, an alkaline aqueous solution development negative electron beam resist, a chemical amplification resist, etc.), or as a resist used for a printed circuit board, a dry film resist, a plating resist, an ED resist, a LDI resist, polyimide, and polybenzoxazole resins. Among them, particularly, those with low water absorptivity are desirable. At least one resin selected from positive photosensitive resin containing polyimide resin and polybenzoxazole resins is preferable. Particularly, it is preferable that the positive photosensitive resin containing polyimide resin is one of "CRC-8000" series manufactured by Sumitomo Bakelite Co., Ltd. This resin can be integrated into a diaphragm by being baked under the conditions of 120° C./4 minutes pre-baking, an exposure of 250 mJ/cm$^2$ (in the case of "CRC-8200") to 400 mJ/cm$^2$ (in the case of "CRC-8300"), 150° C./30 minutes to 320° C./30 minutes final curing.

The materials described above are examples and any materials may be used as long as they are synthetic resin.

Embodiments of the present invention are described with reference to FIGS. 1A to 8J as follows.

Embodiment 1

FIGS. 1A to 1D show simplified sectional views of piezoelectric actuators of the present invention. A piezoelectric element 3 is formed of a strip-like piezoelectric thin film 1, and a lower electrode 2a and an upper electrode 2b superposed so as to sandwich the piezoelectric thin film 1 therebetween. The piezoelectric element 3 is provided with synthetic resin 4 serving as a shape maintaining sheet. The synthetic resin 4 is placed to wrap the piezoelectric element 3. One end of the piezoelectric element 3 is fixed to a fixed part 5 via the lower electrode 2a. When the fixed part 5 is a conductor, the lower electrode 2a is led out via the fixed part 5. When the fixed part 5 is an insulator, a lead 6 is formed on the fixed part 5 to lead out the lower electrode 2a. The upper electrode 2b is connected to an upper electrode lead 6 through a through hole 7 with the synthetic resin 4 as a shape maintaining sheet being used as an insulating layer. An object 8 to be moved is attached to the other end of the piezoelectric element 3 on the opposite side to that on which the fixed part 5 is fixed.

FIG. 1A shows a configuration in which a portion of a substrate for the piezoelectric element 3 is removed by etching or the like, and synthetic resin 4 is used as a shape maintaining sheet.

Figure 1B:
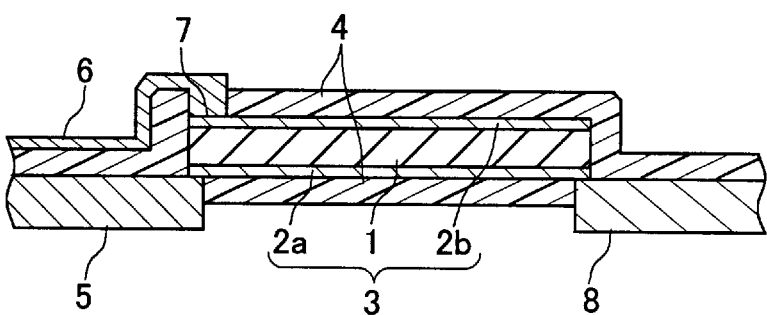

FIG. 1B shows a configuration in which the portion of the substrate for the piezoelectric element 3 is removed by etching or the like, synthetic resin 4 is used as a shape maintaining sheet, and additionally synthetic resin 4 is applied to the etched portion of the substrate for the piezoelectric element 3, as a protective layer.

Figure 1C:
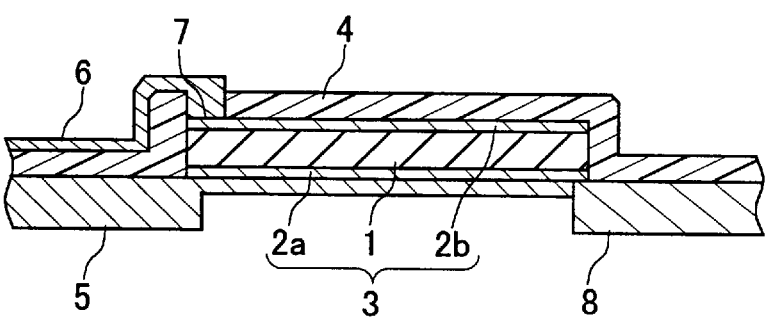

FIG. 1C shows a configuration in which a part of the substrate for the piezoelectric element 3 is processed to be partially thinner by etching or the like and synthetic resin 4 and the remaining substrate are used as shape maintaining sheets.

Figure 1D:
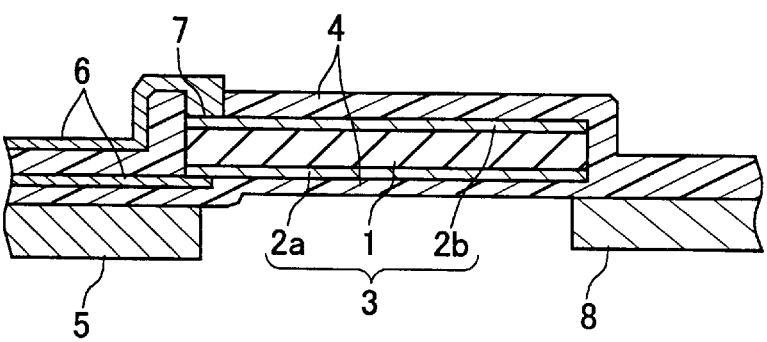

FIG. 1D shows an example of a configuration for the case where a direct application of voltage is intended to be avoided whether the fixed part 5 is an insulator or a conductor. When the fixed part 5 is an insulator, a lead 6 may be formed directly on the fixed part 5 without forming the synthetic resin 4 on the fixed part 5. When the fixed part 5 is a conductor, as shown in FIG. 1D, the synthetic resin 4 is formed on the fixed part 5 and the lead 6 is formed thereon. FIG. 1D shows the configuration with the whole substrate for the piezoelectric element 3 being removed and with the synthetic resin 4 being formed as a protective layer. However, it also is possible to lead out the lower electrode 2a as shown in FIG. 1D even in the configuration shown in FIG. 1A with no synthetic resin 4 being formed or the configuration shown in FIG. 1C with the substrate for the piezoelectric element 3 being removed partially.

Figure 1E:
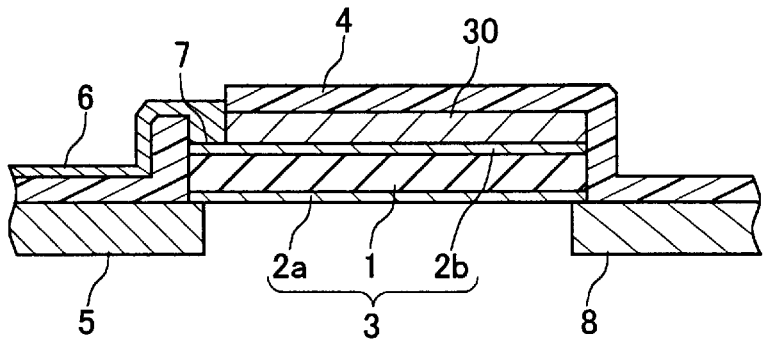
Figure 1F:
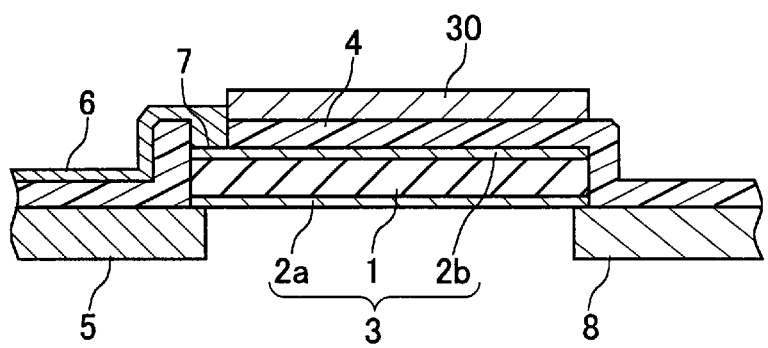
Figure 1G:
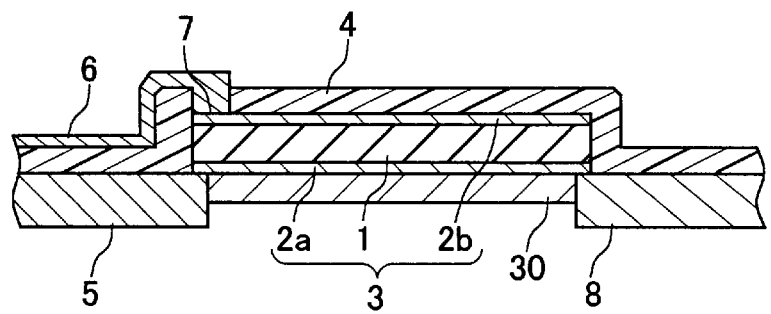

When the synthetic resin 4 as the shape maintaining sheet alone does not provide sufficient stiffness, a reinforcer 30 may be added as shown in FIGS. 1E to 1G. FIG. 1E shows the case where the reinforcer 30 is added between the upper electrode 2b and the synthetic resin 4. FIG. 1F shows the case where the reinforcer 30 is added on the synthetic resin 4 as the shape maintaining sheet. FIG. 1G shows the case where the reinforcer 30 is added under the lower electrode 2a. Examples of the reinforcer include a metal film, an oxide film, and the like. A sputtering method, a vapor deposition method, a plating method, or the like can be used as a method for forming such a film. Preferably, such a film has a thickness of about 1 to 5 $\mu$m.

As shown in FIG. 1D, the piezoelectric element may be formed with both surfaces being covered with the synthetic resin 4 or with the synthetic resin 4 as a shape maintaining sheet having an increased thickness. Preferable methods for applying the synthetic resin 4 include a spinner method (using a spin coater), a roll method, a dipping method, a spray method, an ink jet method, or the like.

Figures 2A, 2B, 2C:
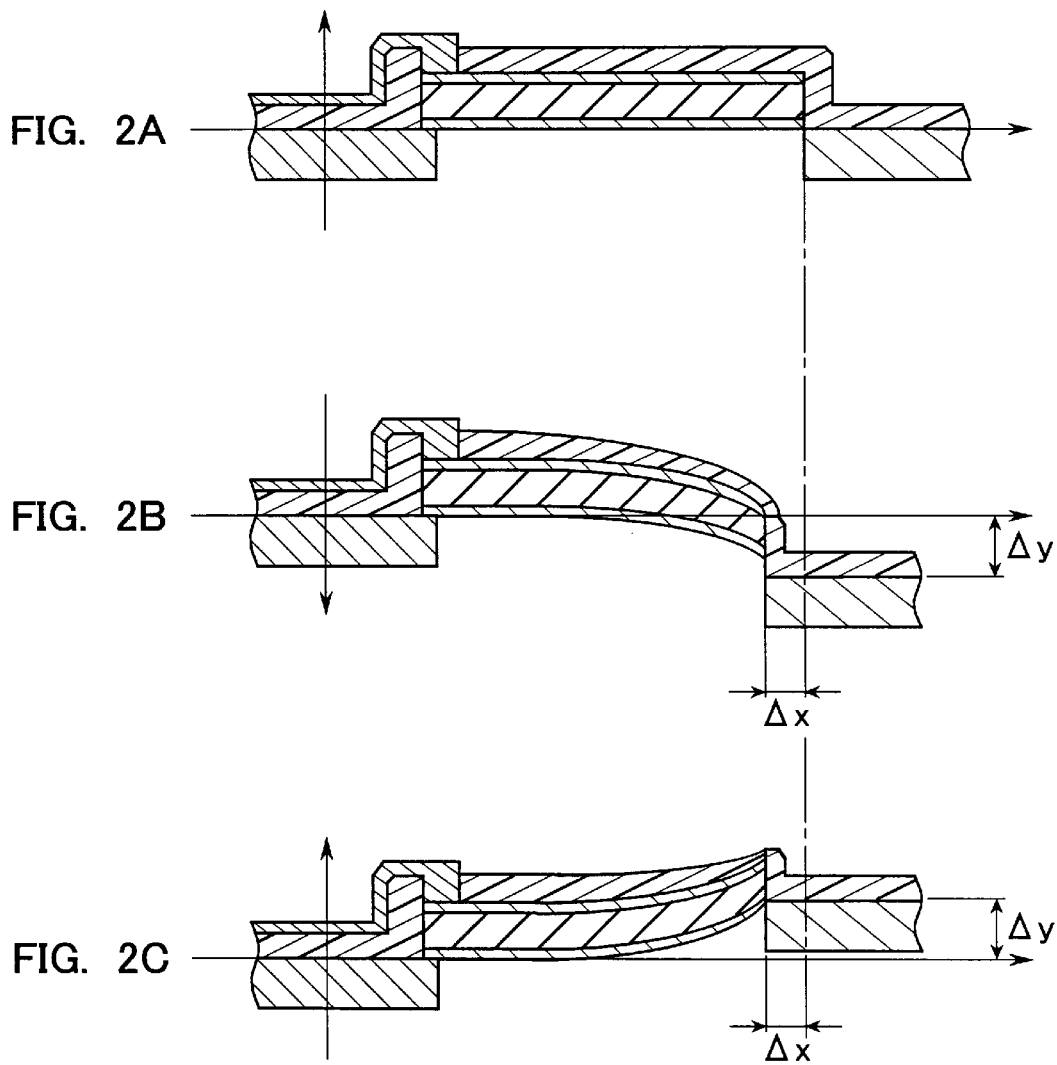
FIGS. 2A to 2C are explanatory sectional views illustrating movements of an actuator according to Embodiment 1 of the present invention.
Figure 3A:
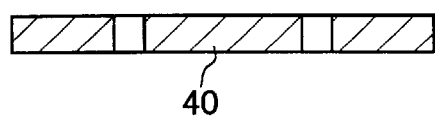
FIGS. 3A to 3F are explanatory sectional views showing a method of forming a piezoelectric element using no metal mask and FIGS. 3G to 3L are explanatory sectional views showing a method of forming a piezoelectric element using a metal mask, according to Embodiment 2 of the present invention.
Figure 3G:
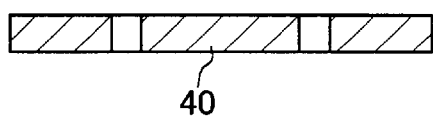
Figure 3B:
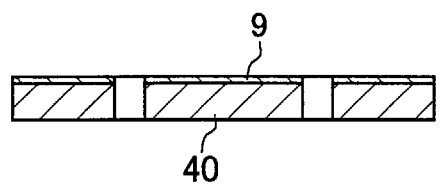
Figure 3H:
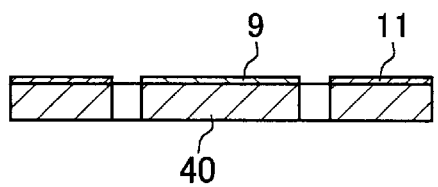
Figure 3C:
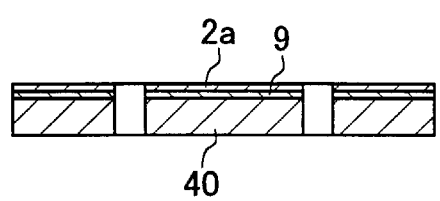
Figure 3I:
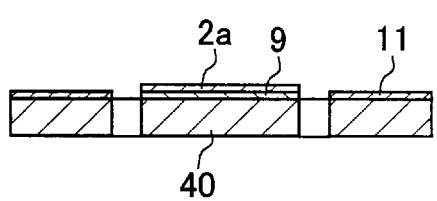
Figure 3D:
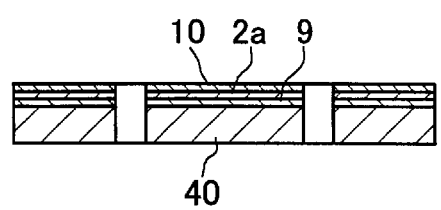
Figure 3J:
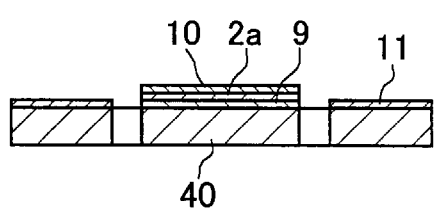
Figure 3E:
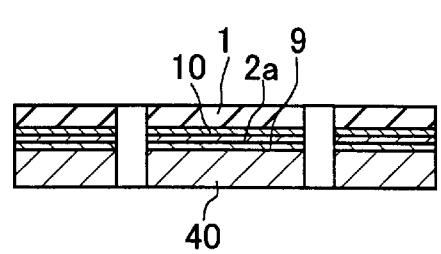
Figure 3K:
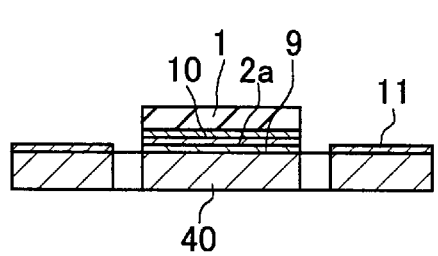
Figure 3F:
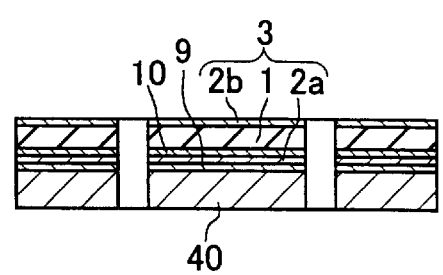
Figure 3L:
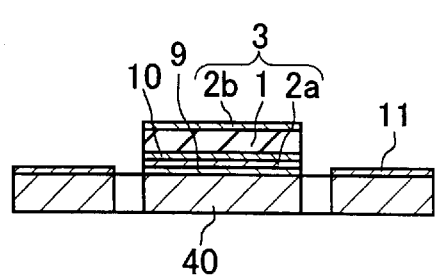

The movements of the piezoelectric element are described with reference to FIGS. 2A to 2C. FIG. 2A shows a state when no voltage is applied. FIG. 2B shows a state when a positive voltage and a negative voltage are applied to the upper electrode and the lower electrode, respectively. FIG. 2C shows a state when a negative voltage and a positive voltage are applied to the upper electrode and the lower electrode, respectively. In the case shown in FIG. 2B, the applications of the voltages cause displacements of $\Delta x$ and $\Delta y$. In the case shown in FIG. 2C, the applications of the voltages cause a displacement of $\Delta x$ and a displacement of $\Delta y$ in the opposite direction to that in the case shown in FIG. 2B. Preferable displacement lengths of $\Delta x$ and $\Delta y$ are in the ranges of 1 to 5 $\mu$m and 10 to 30 $\mu$m, respectively. When two actuators to be used are positioned as two sides of a triangle, preferably they move in a range of 1 to 2 $\mu$m in a tracking direction.

Since the displacements are obtained by the above movements utilizing the flexure of the piezoelectric element mainly in its thickness directions, relatively large displacements can be obtained. The increase in driving frequency enables high speed and high precision control.

In the above, the simplified configurations and movements of piezoelectric actuators of the present invention are described.

Embodiment 2

FIGS. 3A to 3L show methods of manufacturing piezoelectric actuators described in Embodiment 1. Initially, FIGS. 3A to 3L show manufacturing methods, wherein films are formed directly on a substrate processed in an actuator shape and the whole substrate is removed. In this case, FIGS. 3A to 3F and 3G to 3L show steps of pre-processing the substrate itself in an actuator shape, then forming a piezoelectric thin film, and further carrying out partial processing. Therefore, it is necessary for a substrate 40 to be used in this embodiment to satisfy the following conditions. First, the substrate 40 is required to be able to maintain its shape even at 500° C. or higher, at which the film formation is carried out. Second, the substrate 40 is required to be processed easily as an actuator. Metal substrates are desirable as the substrate 40 to be used, particularly, substrates containing stainless steel, aluminum, copper, titanium, or the like as a main component are desirable in view of the film forming temperature, processability, and the like. In addition, substrates containing magnesium oxide (MgO), crystallized glass, or the like as a main component also are preferable.

The substrate 40 is processed in an actuator shape by an etching, molding, or pressing method. In view of the cost, the molding or pressing method is advantageous, but the etching processing is advantageous in processing precision. The processing method to be employed may be selected in view of the cost and the processing precision required for an object to be processed.

Next, the following description is directed to the film formation. In the film formation, a piezoelectric thin film may be formed and then processed in an element shape or a piezoelectric thin film may be formed using a metal mask or the like to prevent the film from being formed on portions of the substrate other than a required portion. In such film formations, the difference is whether the film is formed with a metal mask being placed or is formed over the whole processed substrate. The film formations without and with a metal mask are described with reference to FIGS. 3A to 3L.

FIGS. 3A to 3F show a film formation method using no metal mask. A processed substrate is set on a substrate holder, which is placed in a chamber of a sputtering device. Then, the chamber is brought into a vacuum state. After the confirmation of a substrate temperature of at least about 500° C., a titanium (Ti) film as an adhesive layer 9 is formed to have a thickness of 50 nm and a platinum (Pt) layer, which also serves as a lower electrode 2a is formed to have a thickness of about 50 to 200 nm. The titanium (Ti) film 9 is used for increasing the bond strength between the substrate 40 and the platinum (Pt) layer. Therefore, when the bond strength between the substrate 40 and the Pt layer is high, the Pt layer may be formed directly on the substrate with no titanium film being formed. Next, a PbLiTi film (PLT film) 10 as an undercoat layer is formed to have a thickness of 10 to 50 nm, which promotes crystalline orientation of lead-titanate based $PbZrTiO_3$ as a piezoelectric thin film 1. Afterward, a $PbZrTiO_3$ film as the piezoelectric thin film 1 is formed to have a thickness of 1 to 6 $\mu$m. The thickness of the $PbZrTiO_3$ film is varied depending on the torque required for the actuator to be completed with the film. When the piezoelectric thin film has a constant area, the torque increases in direct proportion to the thickness of the piezoelectric thin film. After the formation of the $PbZrTiO_3$ film, a Pt or Au (gold) film as an upper electrode 2b is formed to have a thickness of 100 to 200 nm.

FIGS. 3G to 3L show a film formation method using a metal mask. A processed substrate is set on a substrate holder and then a metal mask 11 is set using a positioning pin or the like for accurate positioning. After the substrate is fixed to the substrate holder by screwing or the like, this is placed in a chamber of a sputtering device. Then, the chamber is brought into a vacuum state. After the confirmation of a substrate temperature of at least about 500° C., a titanium (Ti) film as an adhesive layer 9 is formed to have a thickness of 50 nm and a platinum (Pt) layer, which also serves as a lower electrode 2a, is formed to have a thickness of about 50 to 200 nm. The titanium (Ti) film 9 is used for increasing the bond strength between the substrate 40 and the platinum (Pt) layer. Therefore, when the bond strength between the substrate 40 and the Pt layer is high, the Pt layer may be formed directly on the substrate with no titanium film being formed. Next, a PbLiTi film 10 as an undercoat layer is formed to have a thickness of 10 to 50 nm, which promotes crystalline orientation of lead-titanate based $PbZrTiO_3$ as a piezoelectric thin film 1. Afterward, a $PbZrTiO_3$ film as the piezoelectric thin film 1 is formed to have a thickness of 1 to 6 $\mu$m. The thickness of the $PbZrTiO_3$ film is varied depending on the torque required for the actuator to be completed with the film. When the piezoelectric thin film has a constant area, the torque increases in direct proportion to the thickness of the piezoelectric thin film.

After the formation of the $PbZrTiO_3$ film, a Pt or Au (gold) film as an upper electrode 2b is formed to have a thickness of 100 to 200 nm. When the respective films to be formed are intended to have different patterns, a required number of metal masks for the different patterns are prepared as the metal mask 11 and are replaced. When all the films to be formed may have the same pattern, the metal mask 11 is not required to be replaced.

Next, with reference to FIGS. 4A to 4I, the following description is directed to the processing of a substrate so that a piezoelectric element 3 (including a lower electrode 2a, a piezoelectric thin film 1, and an upper electrode 2b) is processed using a lithographic technique or the like and a shape maintaining sheet is replaced by synthetic resin.

FIGS. 4A to 4F show a processing method using no metal mask. Initially, synthetic resin 12 was applied to the upper electrode 2b surface. In this case, when the synthetic resin can be patterned as in the case of a resist or photosensitive polyimide, a through hole or a portion uncovered with the synthetic resin 12 is provided so that the upper electrode 2b is led out. Wiring is formed by plating or the like. When synthetic resin that cannot be patterned is used, a wiring pattern is preformed on the substrate to prepare a portion for leading out the electrode and then the synthetic resin 12 is applied, or the synthetic resin 12 is removed partially by laser processing or the like. The synthetic resin 12 is applied using a spinner, roll, or dipping method. In this case, the back surface (the opposite surface to that on which the piezoelectric thin film 1 is formed) of the processed substrate 40 is adhered to a flat glass base or the like with no gap being provided therebetween. Due to this fixing, the synthetic resin thus applied covers the surface of the piezoelectric element 3 at which the upper electrode 2b has been formed and the cross-sections of the piezoelectric thin film 1, but the synthetic resin hardly is applied to the back surface of the processed substrate 40.

The synthetic resin 12 is applied so as to cover the cross-sections of the piezoelectric thin film 1 without fail as shown in the figure. This is necessary for preventing the piezoelectric thin film 1 from being etched in the later steps of etching the piezoelectric element 3 and the substrate portion. The synthetic resin 12 thus applied is cured at an increased temperature using a high temperature oven for further increase in strength. This curing increases not only an etching resistance effect but also electrical resistance and thus the synthetic resin also can be used as an insulating layer for the wiring. Preferable synthetic resins include the aforementioned positive photosensitive resin including polyimide resin, for example, the "CRC-8000" series of resins manufactured by Sumitomo Bakelite Co., Ltd.

After the portions required to be covered are covered with the synthetic resin 12, the upper electrode 2b is etched. For the upper electrode 2b, gold (Au) or platinum (Pt) is used in general and etching methods include dry etching, wet etching, or the like. When the dry etching is employed, an argon gas (Ar) is used for the etching. On the other hand, when the wet etching is employed, for instance, a liquid mixture containing potassium iodide (KI), iodine ($I_2$), and water ($H_2O$) is used for the etching of gold (Au).

Next, the piezoelectric thin film 1 and the PLT film of the undercoat layer 10 were etched. When the films are thin, the dry etching is employed, and when the films are thick, the wet etching is employed. In the dry etching, argon gas (Ar) is used for the etching as in the case of the etching of gold (Au) or platinum (Pt). In the wet etching, an ammonium fluoride solution and hydrofluoric acid and hydrofluoric nitrate are used for the etching.

Afterward, the lower electrode 2a is etched. For the lower electrode 2a, platinum (Pt) is used in general. When the dry etching is employed, argon gas (Ar) is used for the etching. On the other hand, when the wet etching is employed, a liquid mixture of potassium cyanide, ammonium peroxosulfate, and water is used as an etchant.

After the etching, the synthetic resin 12 used as the etching mask may be removed or may remain to be used as a shape maintaining sheet. When the synthetic resin 12 was removed, synthetic resin 12 newly is applied using the same method as in the above.

Next, the description is directed to a step of etching the substrate 40. When the substrate 40 is made of metal such as stainless steel, aluminum, copper or the like, it is etched partially or in whole using a ferric chloride solution, a copper nitrate solution, or the like. The etching methods include various methods such as a spray method, a dipping method, or the like. When the spray method is employed, the etching rate and uniformity can be controlled through the adjustment of the size of droplets of the etchant to be sprayed, spraying pressure, temperature of the etchant, or the like. In this case, the piezoelectric thin film 1 would be etched together with the substrate 40 when not covered with the synthetic resin 12. However, the piezoelectric thin film 1 has been covered with the synthetic resin 12 in the former step and therefore no such a problem arises. In other words, it is important to cover the piezoelectric thin film 1 with the synthetic resin 12. The synthetic resin 12 has a property resistive particularly to acidic etchants and therefore is suitable for such processing. When the substrate 40 as a whole is to be etched, after the substrate 40 is etched, the Pt layer as the lower electrode 2a resistive to an acidic etchant serves as a stopper against the etchant. After the substrate 40 thus is etched, the synthetic resin 12 that served as a pattern for the etching serves as a shape maintaining sheet. Generally, when the piezoelectric thin film 1 is transferred onto a shape maintaining sheet other than the substrate 40, it is common to bond the piezoelectric element 3 and the shape maintaining sheet using a conductive adhesive or the like. In view of the precision, however, it is not preferable when the element is very small. Therefore, the use of such a method enables fine processing and allows the piezoelectric thin film to be transferred onto a shape maintaining sheet other than the substrate without using an adhesive or the like.

Figure 4A:
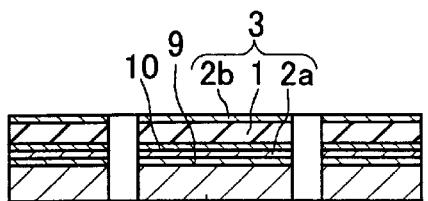
FIGS. 4A to 4F are explanatory sectional views showing a method of manufacturing an actuator using no metal mask and FIGS. 4G to 4I are explanatory sectional views showing a method of manufacturing an actuator using a metal mask, according to Embodiment 2 of the present invention.
Figure 4B:
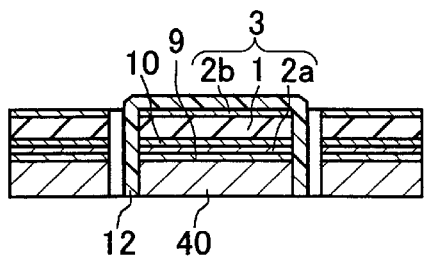
Figure 4C:
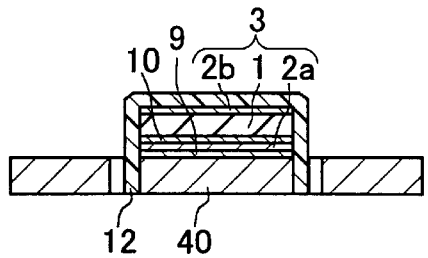
Figure 4D:
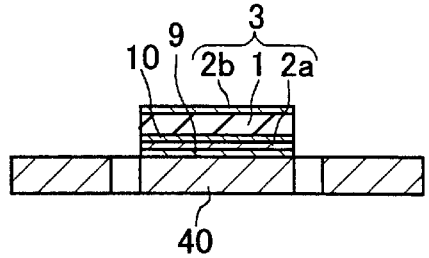
Figure 4E:
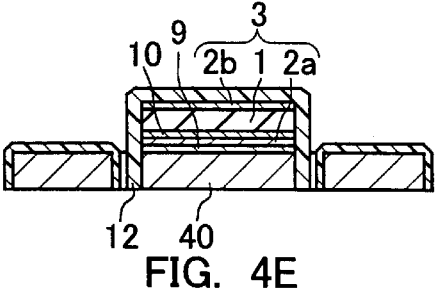
Figure 4F:
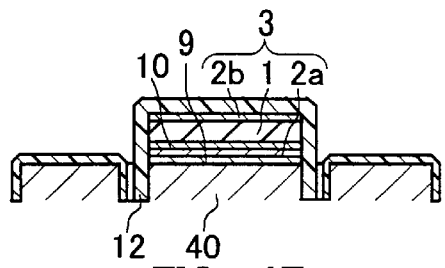
Figure 4G:
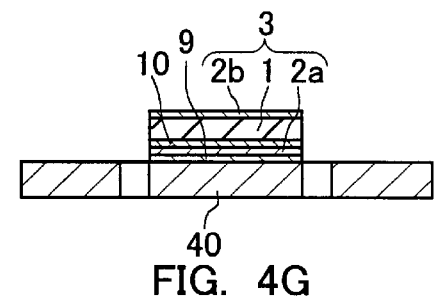
Figure 4H:
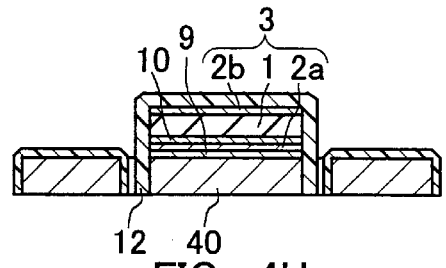
Figure 4I:
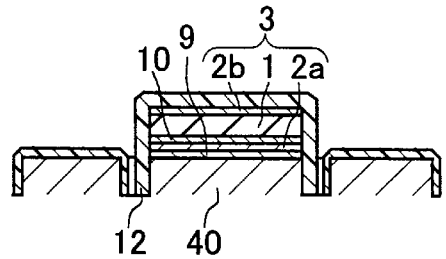
Figure 5A:
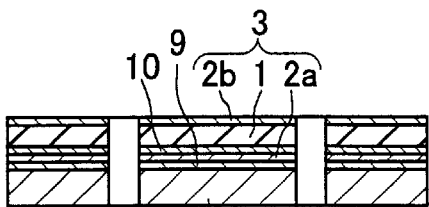
FIGS. 5A to 5F are explanatory sectional views showing a method of manufacturing an actuator using no metal mask and FIGS. 5G to 5I are explanatory sectional views showing a method of manufacturing an actuator using a metal mask, according to Embodiment 2 of the present invention.
Figure 5B:
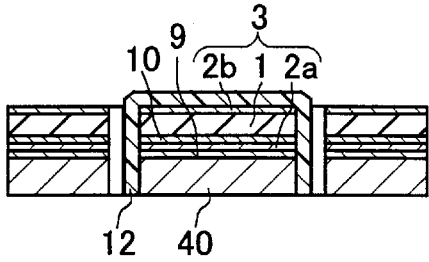
Figure 5C:
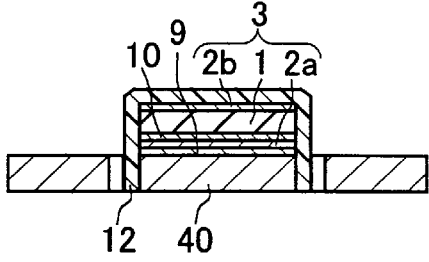
Figure 5D:
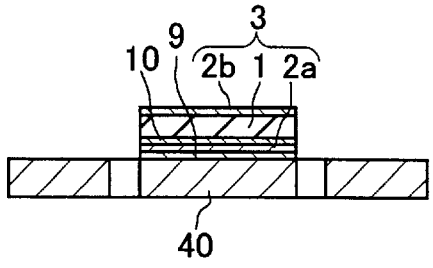
Figure 5E:
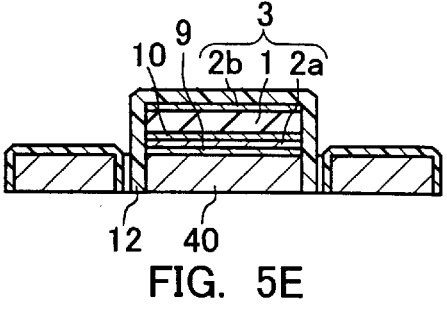
Figure 5F:
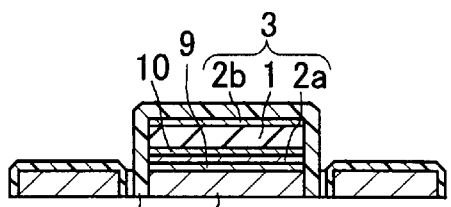
Figure 5G:
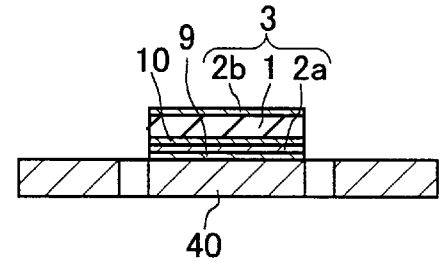
Figure 5H:
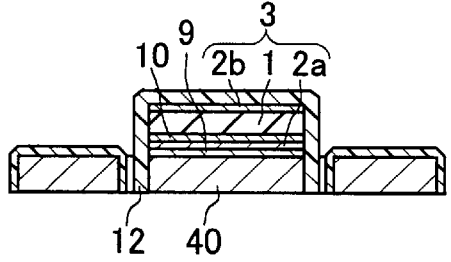
Figure 5I:
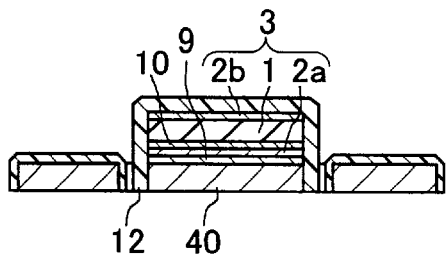

FIGS. 4G to 4I show a processing method using a metal mask. In forming the piezoelectric element 3, a metal mask is used to allow the piezoelectric element 3 to be formed only on a portion of the substrate where it is required to be formed. Therefore, the step of etching the piezoelectric element 3 described in the processing method using no metal mask shown in FIGS. 4A to 4F is omitted. Thus, after the film formation, the synthetic resin 12 is applied to cover the piezoelectric element 3 so that the piezoelectric element 3 does not come into contact with an etchant used for etching the substrate. The substrate 40 is etched as in the above.

FIGS. 5A to 5I show manufacturing methods in which films are formed directly on a substrate 40 processed in an actuator shape and the whole substrate is processed to be thinner by an etching, lapping, polishing, or CMP (chemical mechanical polishing, which is chemical-mechanical complex polishing) method.

The methods of forming a piezoelectric element 3, applying and curing synthetic resin 12, and forming wiring are the same as in the case shown in FIGS. 4A to 4I and therefore their descriptions are not repeated. A significant difference is a method employed for the step of processing the substrate to be thinner. The method is described in detail as follows. When an etching method is employed and the substrate 40 is metal such as stainless steel, aluminum, copper, titanium, or the like, etching is carried out using a ferric chloride solution, a copper nitrate solution, or the like. In the etching, a piezoelectric thin film 1 would be etched together with the substrate 40 when not covered with the synthetic resin 12. However, the piezoelectric thin film 1 has been covered with the synthetic resin 12 in the former step and therefore no such a problem arises. In other words, it is important to cover the piezoelectric thin film 1 with the synthetic resin 12. The synthetic resin 12 has a property resistive particularly to acidic etchants and therefore is suitable for such processing. The degree to which the substrate 40 should be etched depends on the mechanical strength and displacement magnitude required for the actuator to be obtained. The degree can be controlled by the adjustments of the concentration of the etchant, etching time, temperature of the etchant, and etching method to be employed, although they are different depending on the etchant to be used. Generally, the etching methods include a spray method and a dipping method. Particularly, in the spray method, the etching rate and uniformity can be controlled through the adjustment of the size of droplets of the etchant to be sprayed, spraying pressure, temperature of the etchant, or the like.

In a lapping method and a polishing method, the fixed substrate 40 is attached to a fixture, which then is placed on a lapping plate. The lapping plate is rotated at a constant speed while a diamond slurry or the like is sprayed on the substrate 40, and thus the substrate 40 is lapped.

The CMP method is similar to the lapping and polishing methods. In the CMP method, however, etching is carried out chemically while an acidic solution is sprayed instead of the diamond slurry or the like. The substrate is processed to be thinner using such methods.

FIGS. 6A to 6G show manufacturing methods, wherein films are formed directly on a substrate processed in an actuator shape and part of the substrate is removed completely. FIGS. 6A to 6D show steps of forming a piezoelectric element 3 including at least a lower electrode 2a, a piezoelectric thin film 1, and an upper electrode 2b using no mask and shaping the element 3 using a lithographic technique. The steps for processing a piezoelectric element when no metal mask is used are identical with those shown in FIGS. 4A to 4C or FIGS. 5A to 5C and therefore are not shown in the figures.

Figure 6A:
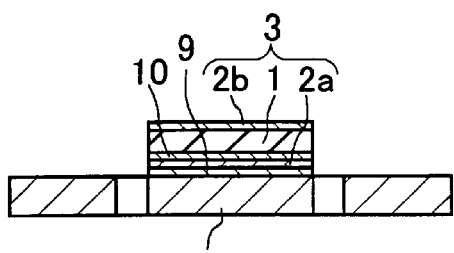
FIGS. 6A to 6D are explanatory sectional views showing a method of manufacturing an actuator using no metal mask and FIGS. 6E to 6G are explanatory sectional views showing a method of manufacturing an actuator using a metal mask, according to Embodiment 2 of the present invention.
Figure 6F:
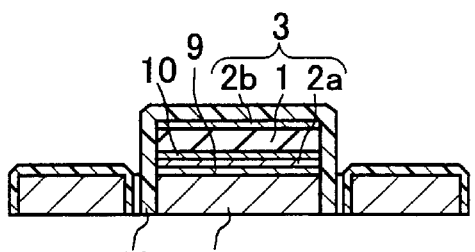
Figure 6B:
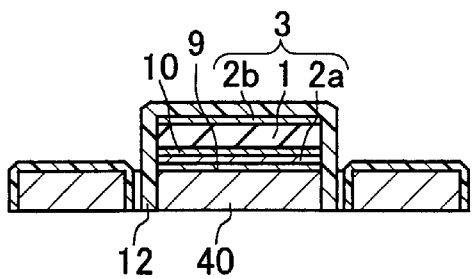
Figure 6G:
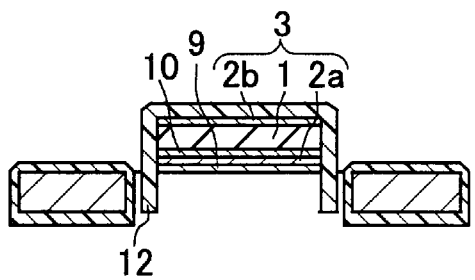
Figure 6C:
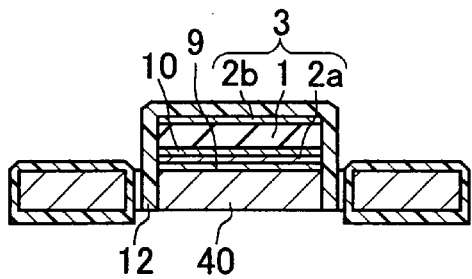
Figure 6D:
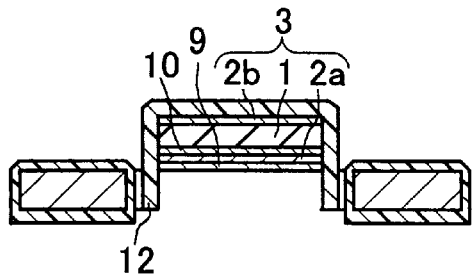
Figure 6E:
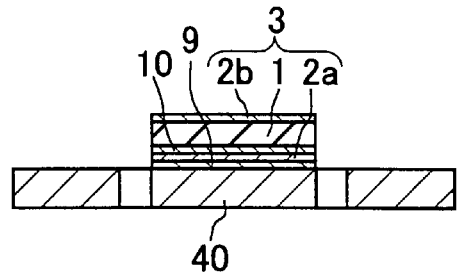

On the other hand, FIGS. 6E to 6G show steps of processing a piezoelectric element 3 including at least a lower electrode 2a, a piezoelectric thin film 1, and an upper electrode 2b using a metal mask. The methods of forming the piezoelectric element 3, applying and curing synthetic resin 12, and forming wiring are the same as in the cases shown in FIGS. 3A to 3L. Therefore, their descriptions are not repeated. A significant difference is steps of applying the synthetic resin 12 also to the back surface (the opposite surface to the surface on which the piezoelectric thin film 1 has been formed) of the processed substrate 40 and forming a pattern with the synthetic resin 12 being removed partially. In FIGS. 6A to 6D, the piezoelectric thin film 1 is formed on the substrate 40, on which the synthetic resin 12 then is applied and cured. Afterward, the synthetic resin 12 is applied to the back surface (the opposite surface to the surface on which the piezoelectric thin film 1 has been formed) of the processed substrate 40. It is fixed to a smooth base of glass or the like with the back surface of the processed substrate 40 being directed upward. In this state, the synthetic resin 12 is applied by the spinner, roll, or dipping method. In this case, the synthetic resin 12 is exposed to light using a mask or the like to be patterned when being photosensitive, an ultraviolet curing type, or the like. The synthetic resin 12 is patterned using a laser or the like after being applied when it is not photosensitive, an ultraviolet curing type, or the like. The pattern is adapted particularly for removing the substrate 40 under the piezoelectric element 3. In other words, only the substrate under the piezoelectric element 3 is prevented from being covered with the synthetic resin 12. After this patterning, the synthetic resin 12 thus applied is cured at an increased temperature using a high temperature oven for further increase in its acid resistance and mechanical strength. Afterward, the substrate 40 is removed by etching. For the removal of the substrate 40 by etching, the structure thus obtained is fixed to a glass base or the like with its patterned surface being directed upward. Then, the portion of the substrate 40 which is not covered with the synthetic resin 12 is removed using a spray method, a dipping method, or the like. When the substrate 40 is metal such as stainless steel, aluminum, copper, titanium, or the like, a ferric chloride solution, a copper nitrate solution, or the like is used.

When the portion of the substrate 40 is etched completely, the platinum (Pt) layer as the lower electrode 2a serves as a stopper and thus the etching is completed. In this process, the portion of the substrate 40 is removed and is replaced by the synthetic resin 12 as a shape maintaining sheet. In this case, the piezoelectric element 3 can be transferred without using an adhesive or the like.

FIGS. 6E to 6G show a processing method using a metal mask. In forming a piezoelectric element 3, a metal mask is used to allow the piezoelectric element 3 to be formed only on a portion of a substrate where it is required to be formed. Therefore, the step of etching the piezoelectric element 3 is omitted, which was described in the processing method using no metal mask shown in FIGS. 6A to 6D. Thus, after the film formation, synthetic resin 12 is applied to cover the piezoelectric element 3 so that the piezoelectric element 3 does not come into contact with an etchant used for etching the substrate. The substrate 40 is etched as in the above.

Figure 7A:
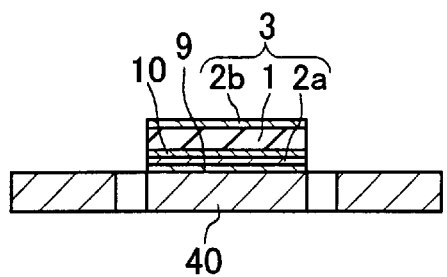
FIGS. 7A to 7D are explanatory sectional views showing a method of manufacturing an actuator using no metal mask and FIGS. 7E to 7G are explanatory sectional views showing a method of manufacturing an actuator using a metal mask, according to Embodiment 2 of the present invention.
Figure 7F:
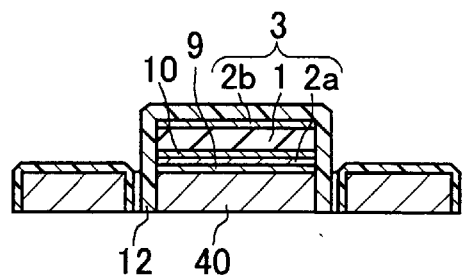
Figure 7B:
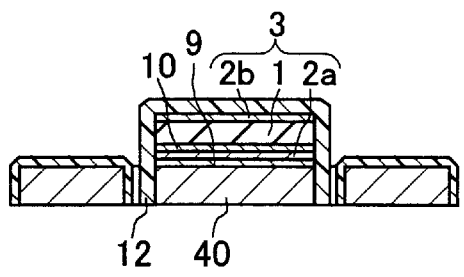
Figure 7G:
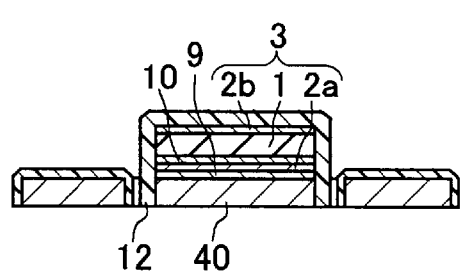
Figure 7C:
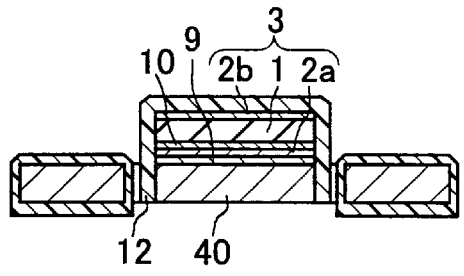
Figure 7D:
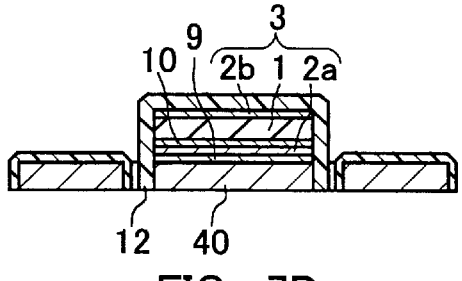
Figure 7E:
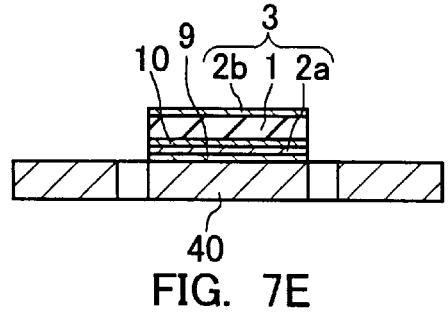
Figure 8A:
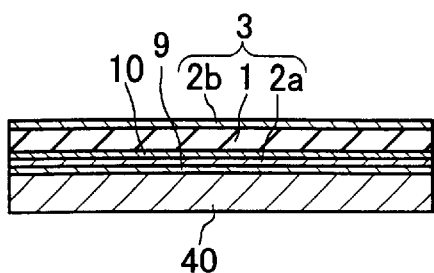
FIGS. 8A to 8F are explanatory sectional views showing a method of manufacturing an actuator using no metal mask and FIGS. 8G to 8J are explanatory sectional views showing a method of manufacturing an actuator using a metal mask, according to Embodiment 2 of the present invention.
Figure 8B:
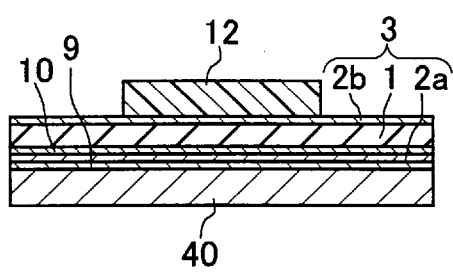
Figure 8C:
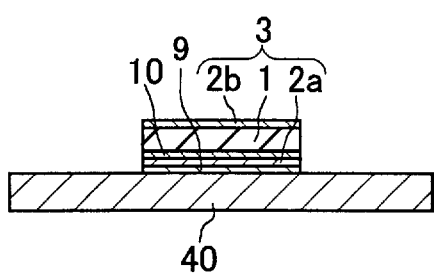
Figure 8D:
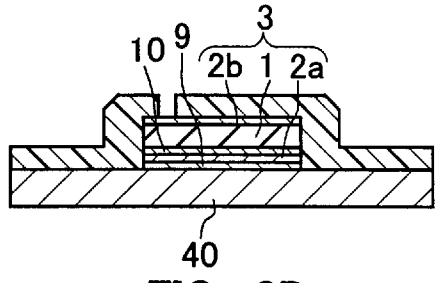
Figure 8E:
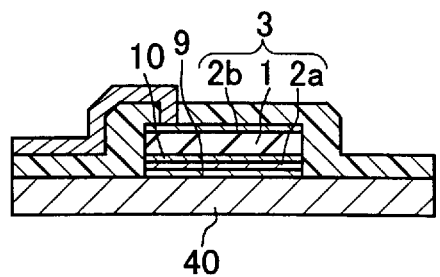
Figure 8F:
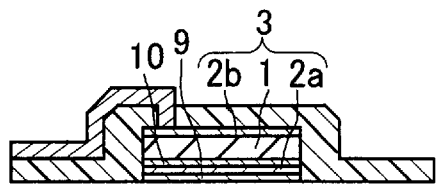
Figure 8G:
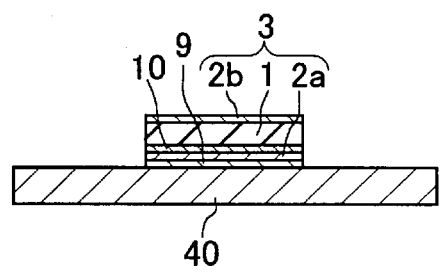
Figure 8H:
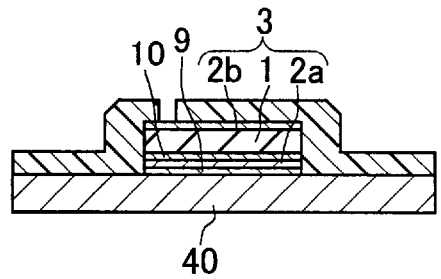
Figure 8I:
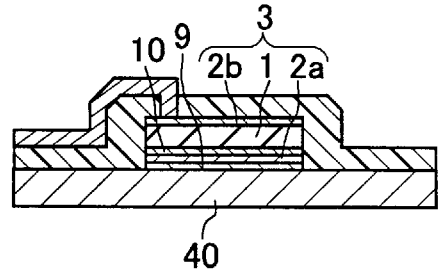
Figure 8J:
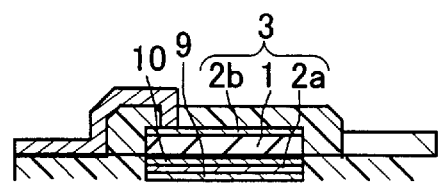
Figure 9A:
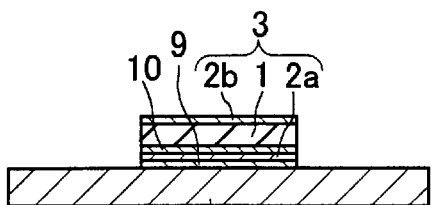
FIGS. 9A to 9E are explanatory sectional views showing a method of manufacturing an actuator without using a processed substrate according to Embodiment 2 of the present invention.
Figure 10A:
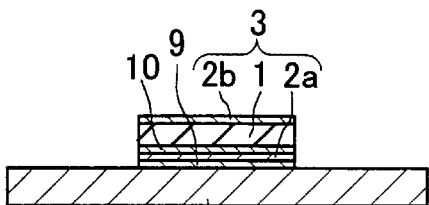
FIGS. 10A to 10D are explanatory sectional views showing a method of manufacturing an actuator without using a processed substrate according to Embodiment 2 of the present invention.
Figure 9B:
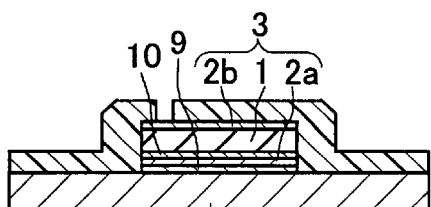
Figure 10B:
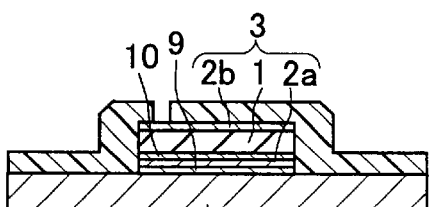
Figure 9C:
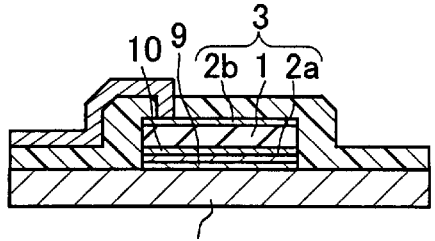
Figure 10C:
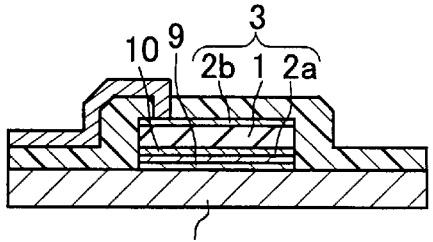
Figure 9D:
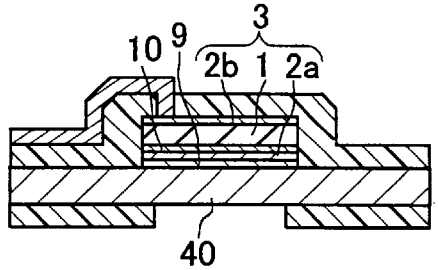
Figure 10D:
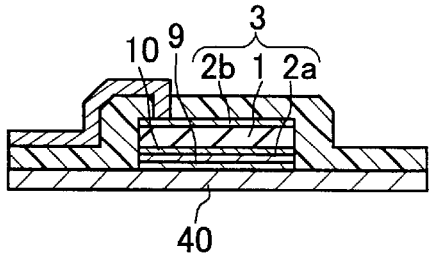
Figure 9E:
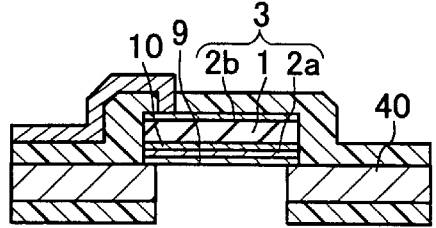
Figure 11A:
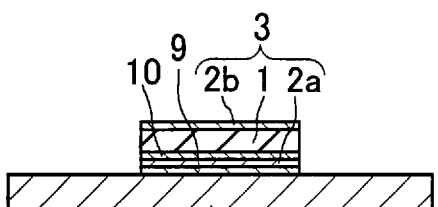
FIGS. 11A to 11E are explanatory sectional views showing a method of manufacturing an actuator without using a processed substrate according to Embodiment 2 of the present invention.
Figure 11B:
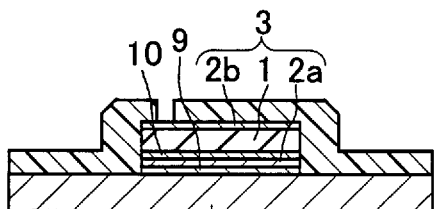
Figure 11C:
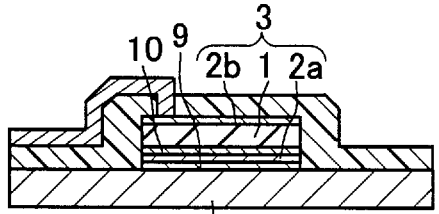
Figure 11D:
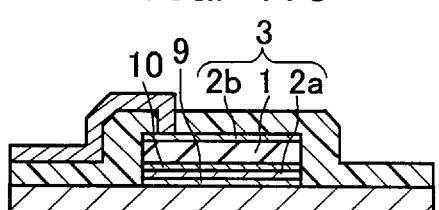
Figure 11E:
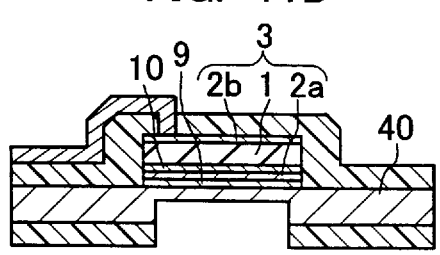

FIGS. 7A to 7G show manufacturing methods, wherein films are formed directly on a substrate processed in an actuator shape and the substrate is processed to be thinner. FIGS. 7A to 7D show steps of forming a piezoelectric element 3 including at least a lower electrode 2a, a piezoelectric thin film 1, and an upper electrode 2b using no metal mask and shaping the element using a lithographic technique or the like. On the other hand, FIGS. 7E to 7G show steps of processing a piezoelectric element 3 including at least a lower electrode 2a, a piezoelectric thin film 1, and an upper electrode 2b using a metal mask. The methods of forming the piezoelectric element 3, applying and curing synthetic resin 12, forming wiring, and patterning the synthetic resin 12 are the same as in the cases shown in FIGS. 3A to 3L. Therefore, their descriptions are not repeated. A significant difference is that the substrate 40 is etched while the etching rate and uniformity are controlled. The degree to which the substrate 40 should be etched depends on the mechanical strength and displacement magnitude required for the actuator to be obtained. The degree can be controlled by the adjustments of the concentration of the etchant, etching time, temperature of the etchant, and etching method to be employed, although they are different depending on the etchant to be used. Generally, the etching methods include a spray method and a dipping method. Particularly, in the spray method, the etching rate and uniformity can be controlled through the adjustment of the size of droplets of the etchant to be sprayed, spraying pressure, temperature of the etchant, or the like.

The control of the above-mentioned conditions enables the manufacture of an actuator having a substrate whose whole or partial portion is processed to be thinner.

FIGS. 8A to 8J show methods of manufacturing actuators, wherein substrates 40 that have not been processed in an actuator shape are used and the whole substrates are removed.

FIGS. 8A to 8F show steps of forming a piezoelectric element 3 including at least a lower electrode 2a, a piezoelectric thin film 1, and an upper electrode 2b using no mask and shaping the element using a lithographic technique or the like. On the other hand, FIGS. 8G to 8J show steps of processing a piezoelectric element 3 including at least a lower electrode 2a, a piezoelectric thin film 1, and an upper electrode 2b using a metal mask. The substrate 40 to be used is required to satisfy the following conditions. First, the substrate should be able to maintain its shape even at a temperature of about 500° C. or higher at which the film formation is carried out. Second, the substrate should be removed easily by etching or the like. Generally, a metal substrate is desirable as the substrate 40 to be used. Particularly, a substrate containing stainless steel, aluminum, copper, titanium, or the like as a main component is desirable in view of the film formation temperature, processability, or the like. In addition, a substrate containing magnesium oxide (MgO) as a main component also is desirable.

With respect to the film formation, there may be used a method in which the piezoelectric thin film is formed and then is processed in an element shape, and a method in which the piezoelectric thin film is formed only on a portion of the substrate where it should be formed using a metal mask or the like. When the film formation precision is required, the processing using a lithographic technique is better than that using the metal mask method.

In the metal mask method, patterns for the respective films to be formed are determined beforehand, and then the metal masks simply are changed depending on the patterns during the film formation. The descriptions of the steps using no metal mask and using a metal mask are not repeated, since they are the same as in the cases shown in FIGS. 3A to 3L.

With reference to FIGS. 8A to 8J, the following description is directed to the processing of the substrate so that a piezoelectric element 3 (including a lower electrode 2a, a piezoelectric thin film 1, and an upper electrode 2b) is processed using the lithographic technique or the like and a shape maintaining sheet is replaced by synthetic resin.

FIGS. 8A to 8F show a processing method using no metal mask. Initially, synthetic resin 12 is applied to the upper electrode 2b surface. In this case, when the synthetic resin 12 can be patterned as in the case of a resist or photosensitive polyimide, a through hole or a portion uncovered with the synthetic resin 12 is provided so that the upper electrode 2b is led out through it. Wiring is formed by plating or the like. When synthetic resin that cannot be patterned is used, a wiring pattern is preformed on the substrate to prepare the portion from which the electrode is led out and then the synthetic resin 12 is applied, or the synthetic resin 12 is removed partially by laser processing or the like. The synthetic resin 12 is applied using a spinner method, a roll method, a dipping method, a spray method, an ink jet method, or the like, wherein the back surface (the opposite surface to that on which the piezoelectric thin film 1 has been formed) of the substrate 40 is adhered to a flat glass base or the like with no gap being provided therebetween. Due to this fixing, the synthetic resin thus applied covers the surface of the upper electrode 2b and the cross-sections of the piezoelectric thin film 1 of the piezoelectric element 3, but the synthetic resin hardly is applied to the back surface of the substrate 40.

The synthetic resin 12 is applied so as to cover the cross-section portions of the piezoelectric thin film 1 without fail as shown in the figure. This is necessary for preventing the piezoelectric thin film 1 from being etched in the later steps of etching the piezoelectric element 3 and the substrate portion. The synthetic resin 12 thus applied is cured at an increased temperature using a high temperature oven for further increase in strength. This curing increases not only an etching resistance effect but also electrical resistance and thus the synthetic resin also can be used as an insulating layer for the wiring.

After the portions to be covered are covered with the synthetic resin 12, the upper electrode 2b is etched. For the upper electrode 2b, gold (Au), platinum (Pt), or the like is used in general and etching methods include dry etching, wet etching, or the like. When the dry etching is employed, an argon gas (Ar) is used for the etching. On the other hand, when the wet etching is employed, a liquid mixture of potassium iodide (KI), iodine ($I_2$), and water ($H_2O$) is used for the etching of gold (Au).

After the upper electrode 2b is etched, the resist is removed. Then, a resist to be used for processing of the piezoelectric thin film 1 newly is applied and then is patterned. In this case, when the resist for the upper electrode 2b has the same pattern as that of the resist used for the etching of the piezoelectric thin film and is excellent in wet etching resistance, the resist used for the processing of the upper electrode 2b also may be used as the resist used for the processing of the piezoelectric thin film 1.

Next, the piezoelectric thin film 1 and the PLT film as the undercoat layer 10 are etched. When the films are thin, the dry etching is employed, and when the films are thick, the wet etching is employed. In the dry etching, an argon gas (Ar) is used for the etching as in the case of the etching of gold (Au) or platinum (Pt). In the wet etching, an ammonium fluoride solution and hydrofluoric acid are used for the etching. The etching is carried out by the method including warming buffered hydrofluoric acid in a beaker to about 60° C. and dipping the films together with the substrate 40 thereinto. The buffered hydrofluoric acid is stirred continuously so as to have a constant concentration. After the films are etched, the structure thus obtained is washed with pure water and then is dried. Afterward, the resist is removed, and another resist newly is applied, is exposed to light and is developed to have a pattern for etching the lower electrode 2a. In this case, it is desirable to form the pattern for the lower electrode 2a to have a one-size larger shape than that of the piezoelectric thin film 1. This allows the piezoelectric thin film 1 to be covered by the lower electrode 2a, the resist of the synthetic resin 12, and the like. Thus, there is no fear that the piezoelectric thin film 1 is exposed to the etchant used when the substrate 40 is removed.

Afterward, the lower electrode 2a is etched. For the lower electrode 2a, platinum (Pt) is used in general. When the dry etching is employed, an argon gas (Ar) is used for the etching. On the other hand, when the wet etching is employed, a liquid mixture of potassium cyanide, ammonium peroxosulfate, and water is used as an etchant.

After the etching, the synthetic resin 12 used as the etching mask may be removed or may remain to be used as a shape maintaining sheet. When the synthetic resin 12 was removed, synthetic resin 12 newly is applied. Depending on the specification of the actuator to be manufactured, the resist used for etching the lower electrode 2a may not be removed and may be allowed to remain to be used as a shape maintaining sheet or an actuator pattern, or another synthetic resin 12 may be applied further on this resist to form the shape maintaining sheet or the actuator pattern. In this step, when the synthetic resin 12 can be patterned as in the case of a resist or photosensitive polyimide, a through hole or a portion uncovered with the synthetic resin 12 is provided so that the upper electrode 2b is led out through it. Wiring is formed by plating or the like. When a synthetic resin that cannot be patterned is used as the synthetic resin 12, a wiring pattern is preformed on the substrate to prepare the portion from which the electrode is led out and then the synthetic resin 12 is applied, or the synthetic resin 12 is removed partially by laser processing or the like.

After the completion of the formation of the shape maintaining sheet or the actuator pattern with the synthetic resin 12, the synthetic resin 12 is cured at an increased temperature using a high temperature oven for further increase in strength. This curing increases not only an etching resistance effect but also electrical resistance and thus the synthetic resin also can be used as an insulating layer for the wiring.

The following description is directed to a step of removing the whole substrate 20 after the curing. After the curing of the synthetic resin 12, the structure thus obtained is fixed to a flat plate such as a glass plate with its synthetic resin 12 side being in contact therewith. Then, a portion of the substrate 40 that is not covered with the synthetic resin 12 is removed by the spray method, the dipping method, or the like. When the substrate 40 is made of metal such as stainless steel, aluminum, copper, titanium or the like, a ferric chloride solution, a copper nitrate solution, or the like is used.

When the substrate 40 is etched completely, the platinum (Pt) layer as the lower electrode 2a serves as a stopper and thus the etching is completed. In this process, the substrate 40 is removed and is replaced by the synthetic resin 12 as a shape maintaining sheet. In this case, the piezoelectric element 3 can be transferred without using an adhesive or the like. Furthermore, since the portions other than the shape maintaining sheet also are pre-patterned, it becomes possible to form the actuator shape and wiring without constraint.

The part from which the lower electrode 2a is led out may be formed by plating through an insulating layer after the removal of the substrate, which is not shown in the figures. Alternatively, a through hole through which the lower electrode is led out may be provided in the synthetic resin as an insulating layer in processing the piezoelectric thin film and thus the lower electrode may be led out to the upper side in the figures through the through hole.

FIGS. 8G to 8J show a processing method using a metal mask. The films of the piezoelectric element 3 are formed using a metal mask only on a portion of the substrate where the piezoelectric element 3 is required to be formed. Therefore, the step of etching the piezoelectric element 3 described in the processing method using no metal mask shown in FIGS. 8G to 8J is omitted. Thus, after the film formation, synthetic resin 12 is applied to cover the piezoelectric element 3, so that the piezoelectric element 3 does not come into contact with an etchant used for etching the substrate. The substrate 40 is etched as in the above. A portion through which the lower electrode 2a is led out, which is not shown in the figures, may be formed by plating or the like through an insulating layer after the removal of the substrate. Alternatively, a through hole through which the lower electrode is led out may be provided in the synthetic resin as an insulating layer in processing the piezoelectric thin film and the lower electrode may be led out to the upper side in the figures through the through hole.

FIGS. 9A to 9E show a method of manufacturing an actuator using a substrate 40 that is not preprocessed in an actuator shape, wherein the substrate is processed to be a part of the actuator and part of the substrate 40 is removed.

FIGS. 9A to 9E show steps of forming films of a piezoelectric element 3 including at least a lower electrode 2a, a piezoelectric thin film 1, and an upper electrode 2b, using no metal mask and then shaping the element using a lithographic technique or the like. The description about the steps of element processing using a metal mask is not repeated since the steps are described in detail with reference to FIGS. 8A to 8F.

The methods of forming the films of the piezoelectric element 3, applying and curing synthetic resin 12, and forming wiring are the same as those in the cases shown in FIGS. 8A to 8J, and therefore their descriptions are not repeated. A significant difference is steps of applying the synthetic resin 12 also to the back surface (the opposite surface to the surface on which the piezoelectric thin film has been formed) of the substrate 40 and forming a pattern with the synthetic resin 12 being removed partially. In FIGS. 9A to 9E, the piezoelectric thin film is formed on the substrate 40, to which the synthetic resin 12 then is applied and is cured. Afterward, the synthetic resin 12 is applied to the back surface (the opposite surface to the surface on which the piezoelectric thin film 1 has been formed) of the substrate 40. It is fixed to a smooth base of glass or the like with the back surface of the substrate 40 being directed upward. In this state, the synthetic resin 12 is applied by the spinner, roll, or dipping method. In this case, the synthetic resin 12 is exposed to light using a mask or the like to be patterned when being photosensitive, an ultraviolet curing type, or the like. The synthetic resin is applied and then is patterned using a laser or the like when not being photosensitive, an ultraviolet curing type, or the like. The pattern is adapted particularly for removing the substrate 40 under the piezoelectric element 3. In other words, only the substrate under the piezoelectric element 3 is prevented from being covered with the synthetic resin 12. After this patterning, the synthetic resin 12 thus applied is cured at an increased temperature using a high temperature oven for further increase in its acid resistance and mechanical strength. Afterward, the substrate 40 is removed by etching. For the removal of the substrate 40 by etching, the structure thus obtained is fixed to a glass base or the like with its patterned surface being directed upward. Then, the portion of the substrate 40 which is not covered with the synthetic resin 12 is removed using a spray method, a dipping method, or the like. When the substrate 40 is metal such as stainless steel, aluminum, copper, titanium, or the like, a ferric chloride solution, a copper nitrate solution, or the like is used.

When the portion of the substrate 40 is etched completely, the platinum (Pt) layer as the lower electrode 2a serves as a stopper and thus the etching is completed. In this process, the portion of the substrate 40 is removed and is replaced by the synthetic resin 12 serving as a shape maintaining sheet. In this case, the piezoelectric element 3 can be transferred without using an adhesive or the like.

The lower electrode 2a is led out through the substrate, which is not shown in the figures, when the substrate is conductive. When the substrate is not conductive or when the leading out through the substrate causes some problem even when the substrate is conductive, a portion allowing the lower electrode 2a to be led out may be formed through the insulating layer by plating or the like after the removal of the substrate, or a through hole for leading out the lower electrode 2a may be provided in the synthetic resin as the insulating layer in processing the piezoelectric thin film and the lower electrode 2a may be led out to the upper side in the figures through the through hole.

The following description is directed to a processing method using a metal mask. When the films of the piezoelectric element 3 are formed, the piezoelectric element 3 is formed only on the portion of the substrate where it is required to be formed, using a metal mask. Therefore, the step of etching the piezoelectric element 3 described in the processing method using no metal mask shown in FIGS. 8A to 8F is omitted. After the film formation, synthetic resin 12 is applied to cover the piezoelectric element 3, so that the piezoelectric element 3 does not come into contact with an etchant used for the etching of the substrate. The etching of the substrate 40 is carried out as in the case of using no metal mask.

FIGS. 10A to 10D show a method of manufacturing an actuator using a substrate that is not preprocessed in an actuator shape, wherein the substrate is processed to be a part of the actuator and the whole substrate is processed to be thinner by an etching, lapping, polishing, or CMP method.

FIGS. 10A to 10D show steps of forming films of a piezoelectric element 3 including at least a lower electrode 2a, a piezoelectric thin film 1, and an upper electrode 2b, using no metal mask and then shaping the element using a lithographic technique or the like. The description about the steps of element processing using a metal mask is not repeated since the steps are described in detail with reference to FIGS. 8G to 8J.

The methods of forming the films of the piezoelectric element 3, applying and curing synthetic resin 12, and forming wiring are the same as those in the cases shown in FIGS. 8A to 8J, and therefore their descriptions are not repeated. A significant difference is a method of processing the substrate to be thinner. The method is described in detail as follows. When an etching method is employed and the substrate 40 is metal such as stainless steel, aluminum, copper, titanium, or the like, etching is carried out using a ferric chloride solution, a copper nitrate solution, or the like. In the etching, the piezoelectric thin film 1 would be etched together with the substrate 40 when not covered with the synthetic resin 12. However, the piezoelectric thin film 1 has been covered with the synthetic resin 12 in the former step and therefore no such a problem arises. In other words, it is important to cover the piezoelectric thin film 1 with the synthetic resin 12. The synthetic resin 12 has a property resistive particularly to acidic etchants and therefore is suitable for such processing. The degree to which the substrate 40 should be etched depends on the mechanical strength and displacement magnitude required for the actuator to be obtained. The degree can be controlled by the adjustments of the concentration of the etchant, etching time, temperature of the etchant, and etching method to be employed, although they are different depending on the etchant to be used. Generally, the etching methods include a spray method and a dipping method. Particularly, in the spray method, the etching rate and uniformity can be controlled through the adjustment of the size of droplets of the etchant to be sprayed, spraying pressure, temperature of the etchant, or the like.

In a lapping method and a polishing method, the fixed substrate 40 is attached to a fixture, which then is placed on a lapping plate. The lapping plate is rotated at a constant speed while a diamond slurry or the like is sprayed on the substrate 40, and thus the substrate 40 is lapped.

The CMP method is similar to the lapping and polishing methods. In the CMP method, however, etching is carried out chemically while an acidic solution is sprayed instead of the diamond slurry or the like. The substrate is processed to be thinner using such methods.

In such processing, the substrate is removed and is replaced by the synthetic resin serving as a shape maintaining sheet. In this case, the piezoelectric element can be transferred without using an adhesive or the like. Furthermore, when the portions other than the shape maintaining sheet also are pre-patterned, it becomes possible to form the actuator shape and wiring without constraint.

The lower electrode 2a is led out through the substrate, which is not shown in the figures, when the substrate is conductive. When the substrate is not conductive or when the leading out through the substrate causes some problem even when the substrate is conductive, a through hole for leading out the lower electrode 2a may be pre-formed in the synthetic resin as the insulating layer in processing the piezoelectric thin film and the lower electrode 2a may be led out to the upper side in the figures through the through hole.

FIGS. 11A to 11E show a method of manufacturing an actuator using a substrate that is not preprocessed in an actuator shape, wherein the substrate is processed to be a part of the actuator and part of the substrate is processed to be thinner.

FIGS. 11A to 11E show steps of forming films of a piezoelectric element 3 including at least a lower electrode 2a, a piezoelectric thin film 1, and an upper electrode 2b, using no metal mask and then shaping the element using a lithographic technique or the like. The description about the steps of element processing using a metal mask is not repeated since the steps are described in detail with reference to FIGS. 8G to 8J.

The methods of forming films of the piezoelectric element 3, applying and curing synthetic resin 12, and forming wiring are the same as those in the cases shown in FIGS. 8A to 8J, and therefore their descriptions are not repeated. A significant difference is that the substrate 40 is etched while the etching rate and uniformity are controlled. The degree to which the substrate 40 should be etched depends on the mechanical strength and displacement magnitude required for the actuator to be obtained. The degree can be controlled by the adjustments of the concentration of the etchant, etching time, temperature of the etchant, and etching method to be employed, although they are different depending on the etchant to be used. Generally, the etching methods include a spray method and a dipping method. Particularly, in the spray method, the etching rate and uniformity can be controlled through the adjustment of the size of droplets of the etchant to be sprayed, spraying pressure, temperature of the etchant, or the like.

Through the control of the above-mentioned conditions, an actuator with a substrate processed to have a thinner portion can be manufactured. The lower electrode 2a is led out through the substrate, which is not shown in the figures, when the substrate is conductive. When the substrate is not conductive or when the leading out through the substrate causes some problem even when the substrate is conductive, a through hole for leading out the lower electrode 2a may be pre-formed in the synthetic resin as the insulating layer in processing the piezoelectric thin film and the lower electrode 2a may be led out to the upper side in the figures through the through hole.

Embodiment 3

Figure 12:
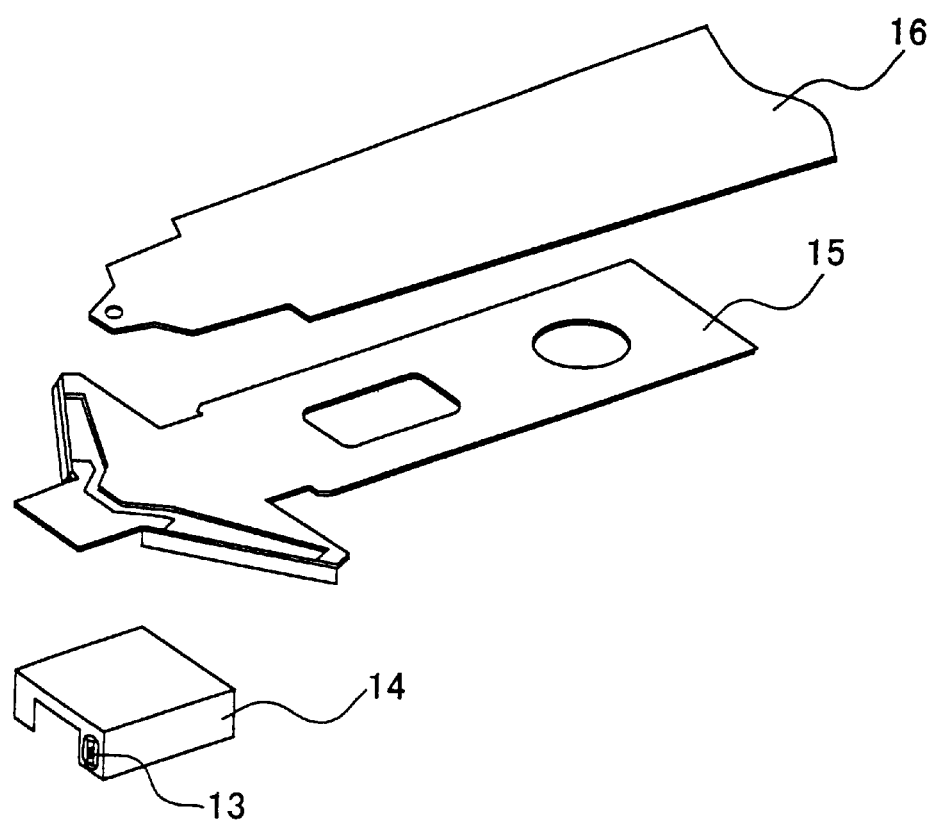
FIG. 12 is an assembly drawing showing a basic configuration of an actuator mechanism according to Embodiment 3 of the present invention.

FIG. 12 shows a basic configuration of a two-stage actuator according to the present invention.

A head supporting mechanism includes a slider 14, a suspension 15 for supporting the slider 14, a base plate 16 for fixing the suspension 15, a load beam (not shown in the figure) for imposing a load on the slider 14, and a signal system (not shown in the figure), which are formed integrally partially or as a whole. The slider 14 on which a head element 13 is mounted flies or slides on a rotating or running recording medium. The signal system electrically connects the head element 13 and a recording/reproducing circuit of an information recording/reproducing device. A lead of the signal system and the suspension are provided with wirings directly or indirectly by means of printed circuits.

An actuator driven minutely is disposed between the slider 14 including the head element 13 and the base plate 16 while being integrated with the suspension 15.

Figure 13A:
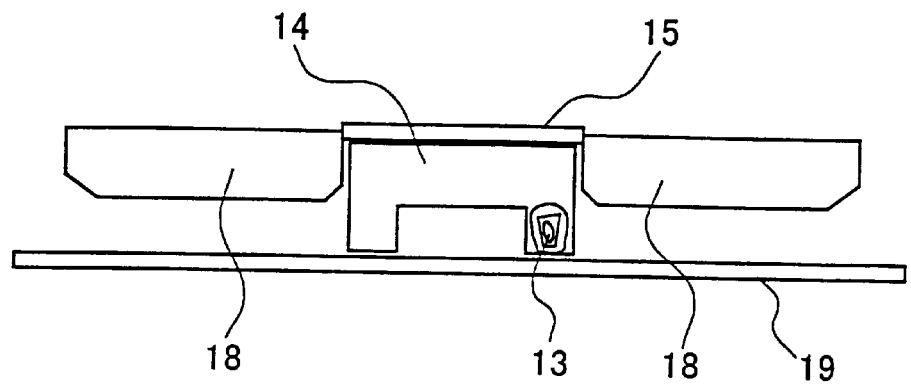
FIG. 13A is a sectional view showing the positional relationship between drive elements of an actuator part according to Embodiment 3 of the present invention and a disk surface.

As shown in FIG. 13A, the actuator is formed of stainless steel with a thickness of about 10 to 30 $\mu$m to be a base material and piezoelectric thin films of respective minutely driving elements 18. The minutely driving elements 18 are bent so as to be perpendicular to a disk surface 19.

Figure 13B:
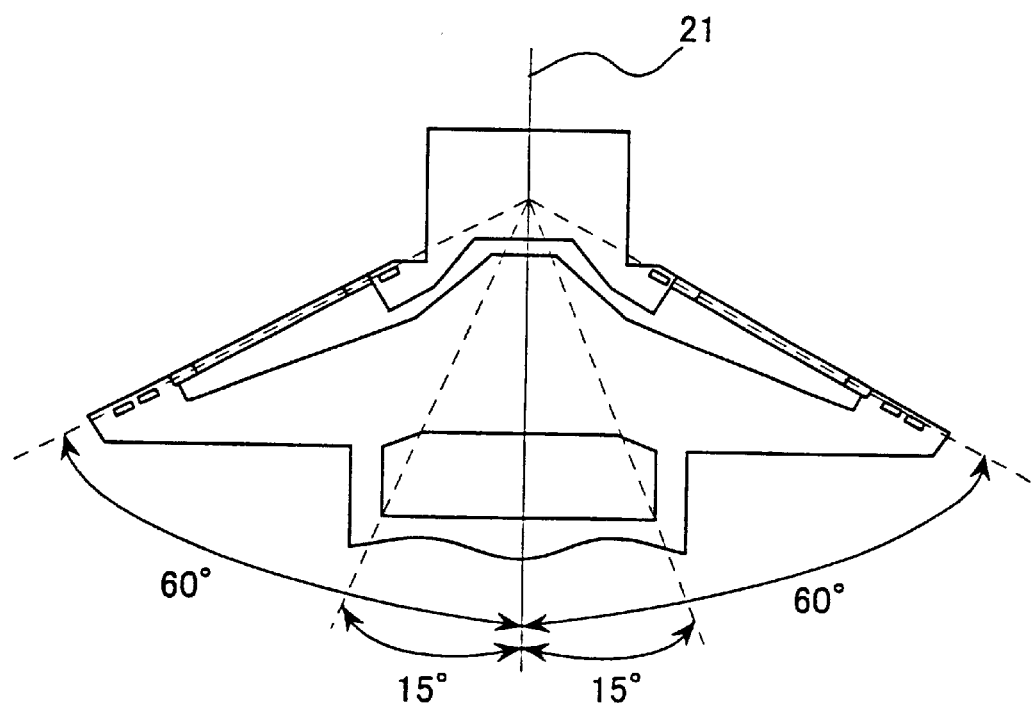
FIG. 13B shows the angles between driving elements of the actuator part and a plane that is perpendicular to a disk surface and is along the longitudinal centerline of a suspension.

Furthermore, as shown in FIG. 13B, the respective minutely driving elements 18 are positioned to define an angle of at least 15° with respect to the plane that is perpendicular to the disk surface and is along the longitudinal centerline of the suspension.

Figure 14A:
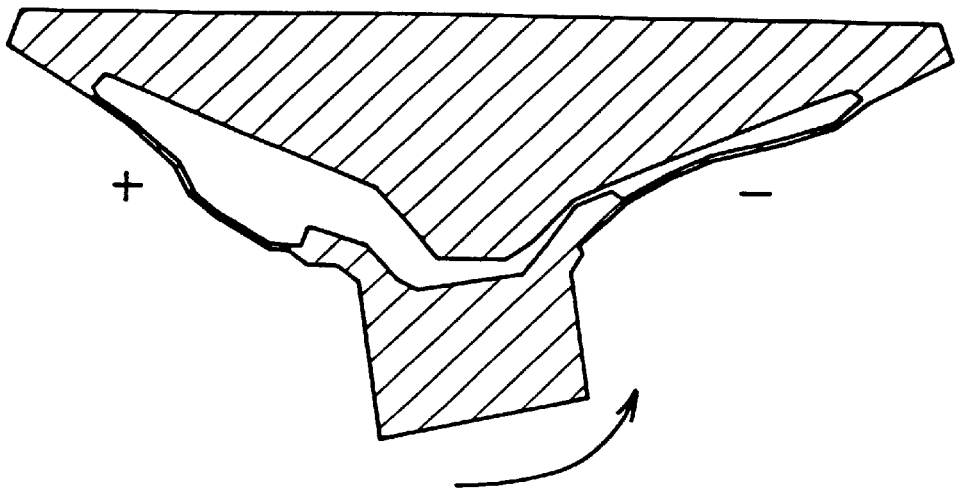
FIGS. 14A and 14B show movements of the actuator according to Embodiment 3 of the present invention.
Figure 14B:
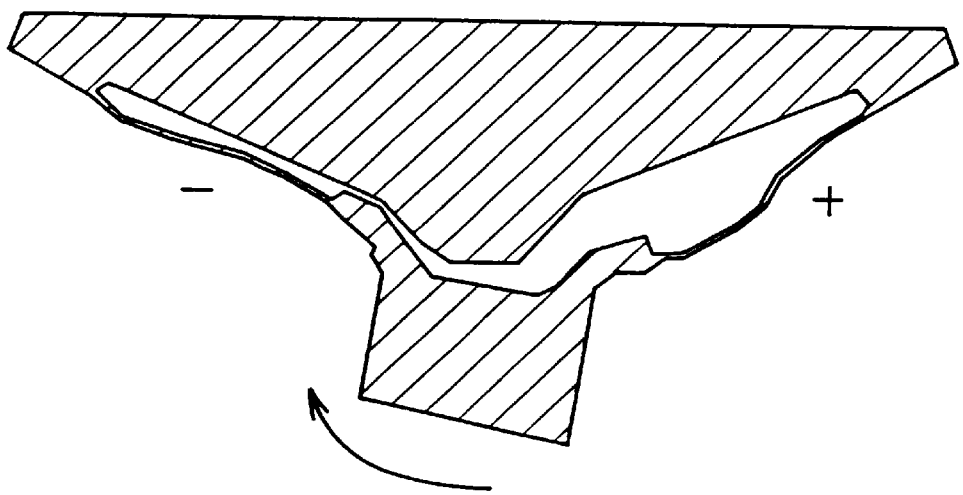

Driving voltages in reversed phase by 90 degrees are applied to the respective minutely driving elements 18, so that they are extended and contracted repeatedly. By the extension and contraction, the suspension 15, and the slider 14 and the head element 13 fixed to the suspension 15 are rotated as shown in FIG. 14A. Furthermore, when the driving voltage is reversed in phase, the suspension 15, and the slider 14 and the head element 13 fixed to the suspension 15 are rotated in the opposite direction as shown in FIG. 14B.

The respective minutely driving elements 18 are positioned to define an angle of at least about 15° with respect to the plane 21 perpendicular to the disk surface. This is intended to reduce an influence (air viscous frictional force) on the slider 14 by the disk rotation since the slider 14 tends to be subjected to the influence when the angle is small (about 0° to below 15°). The above-mentioned configuration enables highly accurate positioning with respect to a track.

In the above, stainless steel was used as a base material of the actuators. However, any materials may be used as the base material as long as they have a spring property and heat resistance and can ensure a certain level of stiffness even if they are thin.

FIGS. 15A and 15B, FIGS. 16A and 16B, and FIGS. 17A and 17B show configurations of two-stage actuators according to the present invention in which synthetic resin 12 is applied to minutely driving elements 18.

When the minutely driving elements 18 have high stiffness, the moving distance (displacement) of the slider 14 and the head element 13 fixed to the suspension 15 due to their rotation by the actuator is about one fourth the displacement obtained when the minutely driving elements 18 move individually (in a cantilever shape).

This is caused by a loss resulting from the fixation and constraint of both ends of each of a pair of minutely driving elements 18. Therefore, when the synthetic resin 12 is used for the minutely driving elements 18, forces generated by the respective driving elements 18 can be transmitted efficiently to the suspension 15, and the slider 14 and the head element 13 fixed to the suspension 15 and thus a large amount of displacement can be obtained.

Figure 15A:
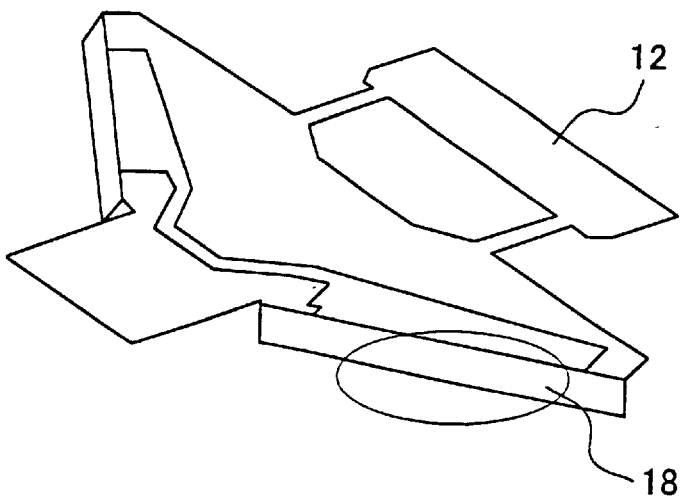
FIG. 15A is a structural view in which an actuator according to Embodiment 3 of the present invention is applied to a hard disk.
Figure 15B:
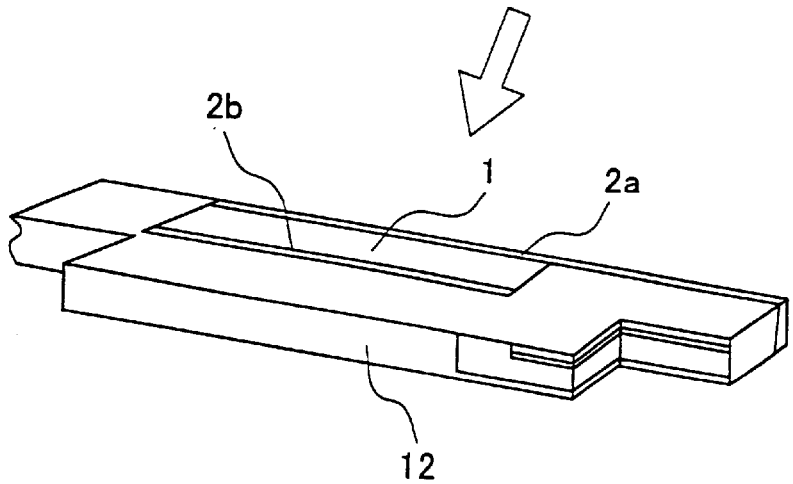
FIG. 15B is a partially enlarged view showing the portion circled in FIG. 15A.
Figure 16A:
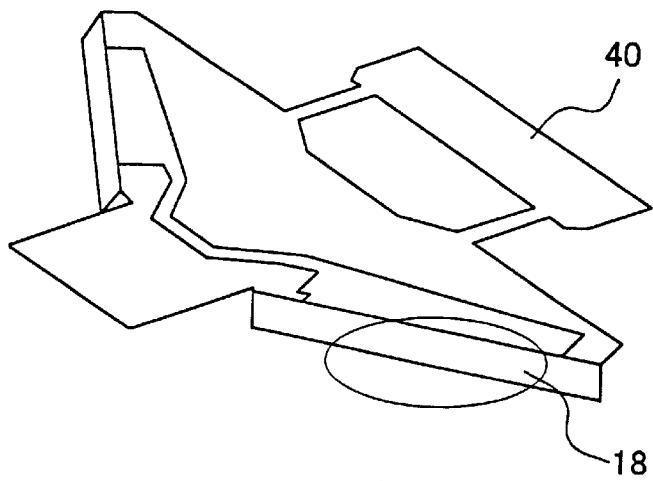
FIG. 16A is a structural view in which an actuator according to Embodiment 3 of the present invention is applied to a hard disk.
Figure 17A:
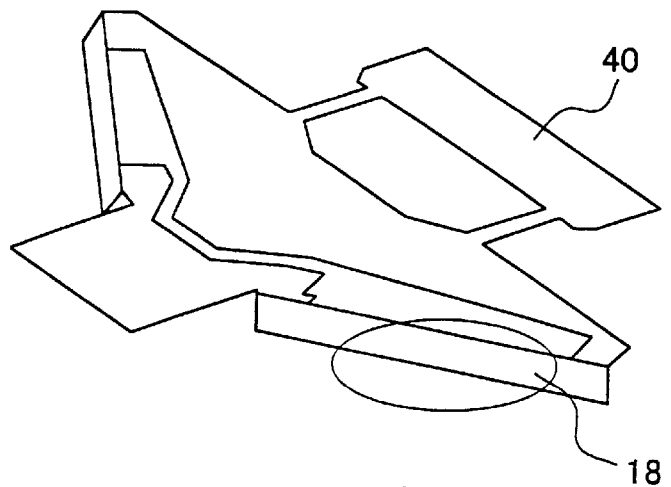
FIG. 17A is a structural view in which an actuator according to Embodiment 3 of the present invention is applied to a hard disk.
Figure 17B:
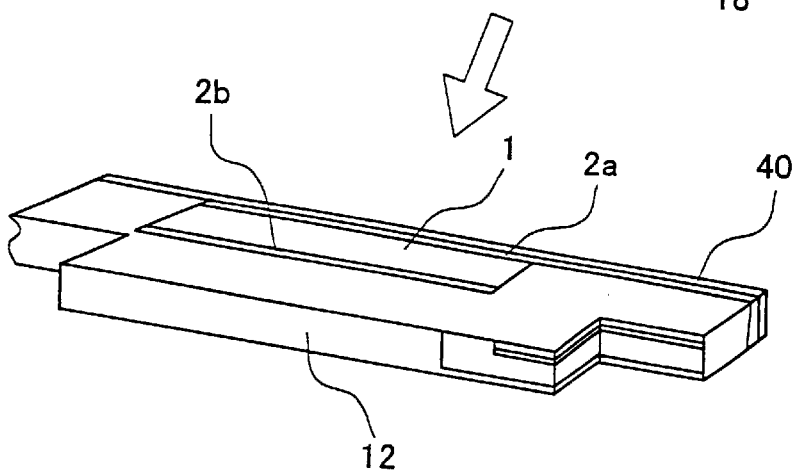
FIG. 17B is a partially enlarged view showing the portion circled in FIG. 17A.

As methods using the synthetic resin 12, all of the actuator part, shape maintaining sheet, and the like may be replaced using a flexible and elastic material such as the synthetic resin 12 as shown in FIGS. 15A and 15B so that the displacement of the minutely driving elements 18 is increased as much as possible, or only the minutely driving elements 18 may be replaced by such a material as shown in FIGS. 16A an 16B. Alternatively, as shown in FIGS. 17A and 17B, all of the actuator part, shape maintaining sheet, and the like may be processed to be thinner by etching or the like, or only the minutely driving elements 18 may be processed to be thinner by etching or the like.

The use of such methods decreases the stiffness and thus can increase the displacement of the minutely driving elements 18. In addition, the state where the pair of minutely driving elements 18 constrain each other, which decreases the efficient, can be relaxed by the flexible configuration of the minutely driving elements 18, which leads to the increase in displacement.

Figure 18:
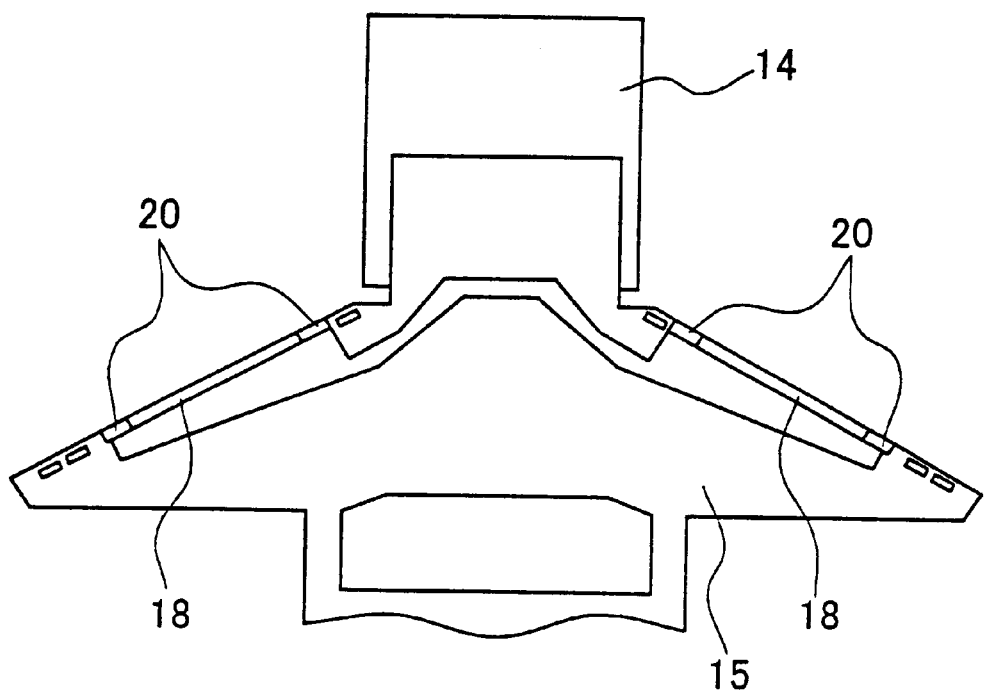
FIG. 18 is an explanatory drawing showing the case where constraint relaxing members are incorporated into an actuator according to Embodiment 3 of the present invention.

As shown in FIG. 18, constraint relaxing members 20 may be formed using synthetic resin 12 at both ends of the respective minutely driving elements 18.

The manufacturing method was described in detail with reference to FIGS. 3A to 11E and therefore its description is not repeated.

Figure 19:
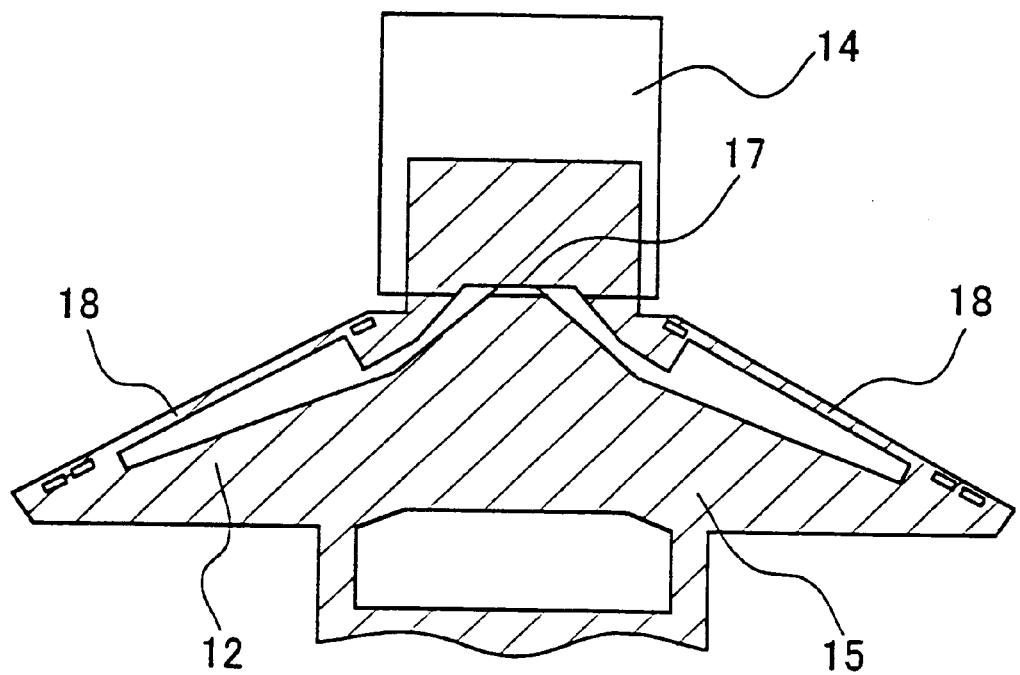
FIG. 19 is an explanatory drawing showing the case where a supporting point is provided in an actuator according to Embodiment 3 of the present invention.

When some problem in mechanical characteristics arises due to the decrease in stiffness of the portions other than the driving parts by the replacement of all the actuator part, shape maintaining sheet, and the like using a flexible and elastic material such as the synthetic resin 12 as shown in FIGS. 15A and 15B, such a problem is resolved, for example, through an addition of a supporting point 17 formed of the synthetic resin 12 as shown in FIG. 19.

Embodiment 4

Figure 20:
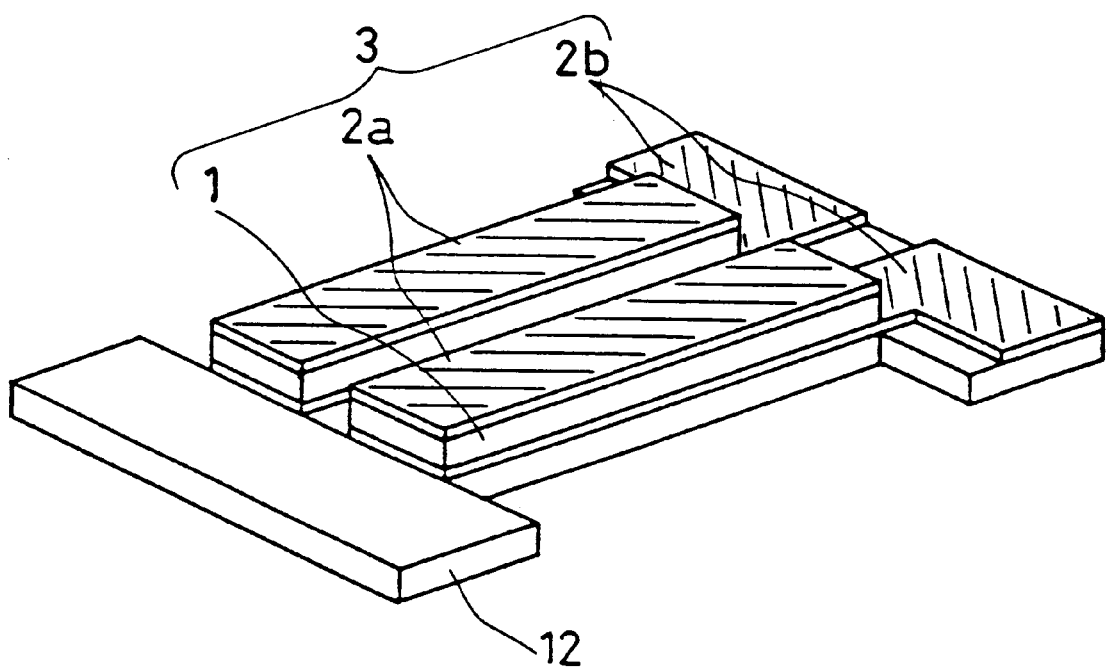
FIG. 20 is a perspective view showing a configuration of an actuator according to Embodiment 4 of the present invention.

FIG. 20 shows another basic configuration of a two-stage actuator according to the present invention. Piezoelectric elements 3 each of which includes a lower electrode 2a, a piezoelectric thin film 1, an upper electrode 2b have been transferred onto synthetic resin 12 with the whole substrate (not shown in the figure) being removed. The synthetic resin 12 is formed in an actuator shape and the piezoelectric elements 3 are disposed on a beam structure.

The method of manufacturing the actuator was described in detail with reference to FIGS. 3A to 11E and therefore its description is not repeated.

Figure 21A:
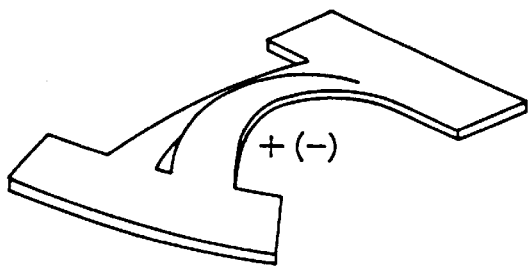
FIGS. 21A to 21D are explanatory drawings showing movements of the actuator according to Embodiment 4 of the present invention.
Figure 21B:
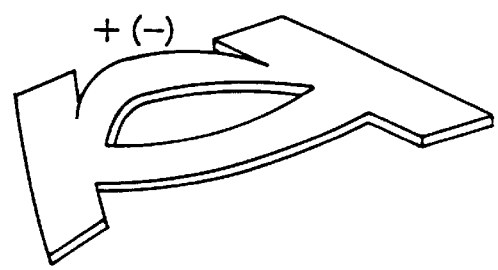
Figure 21C:
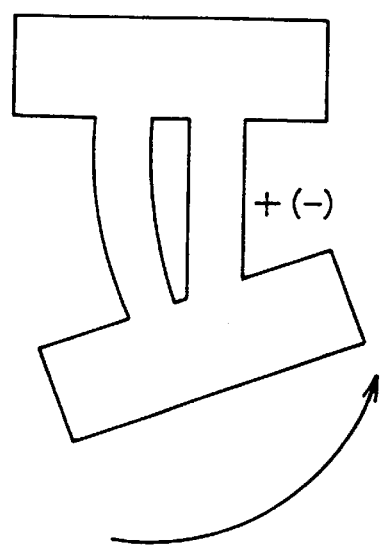
Figure 21D:
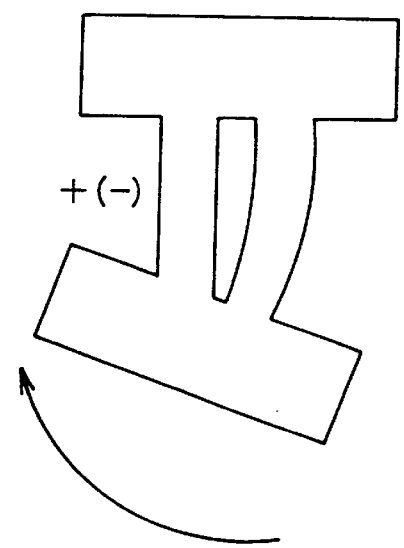

FIGS. 21A, 21B, 21C, and 21D show movements of the actuator. FIG. 21A shows the movement when a voltage is applied to a piezoelectric element 3 on the right side in the figure. When the upper portion in the figure is fixed and voltage is applied to the beam portion on the right side in the figure, the piezoelectric element 3 is bent and its free end on the opposite side to its fixed end is displaced to the right. On the other hand, as shown in FIGS. 21B and 21D, when voltage is applied to the beam portion on the left side in the figure, the piezoelectric element 3 positioned on the left side in the figure is bent and its free end on the opposite side to its fixed end is displaced to the left.

Embodiment 5

FIGS. 22A1, 22A2, 22B1, 22B2, 22C1, 22C2, 22D1, and 22D2 show wiring configurations of piezoelectric actuators according to the present invention.

FIG. 22A1 is a perspective view showing the state after wiring is formed and is bent together with a substrate so that a three dimensional structure is formed. FIG. 22A2 is a sectional view showing the state after the wiring is formed and is processed to be bent by pressing.

A conductive stainless steel material or the like is used for a substrate 40 and a lower electrode 2a is led out through the substrate 40. On the other hand, in order to lead out an upper electrode 2b, a piezoelectric element on the substrate 40 is processed, synthetic resin 4 is patterned as an insulating layer on the upper electrode 2b, and a through hole 7 is formed in the synthetic resin 4 as an insulating layer to allow the upper electrode 2b to be led out therethrough. After the synthetic resin 4 is heat-treated in a nitrogen atmosphere to be cured, copper wiring is formed by plating. After the formation of the copper wiring, synthetic resin 4 is applied to form a cover, is patterned, and is heat-treated in a nitrogen atmosphere to be cured. Afterward, the structure thus obtained was bent together with the substrate using a press. Consequently, a three dimensional structure is formed.

Such formation of wiring using the synthetic resin 4 enables the electrode to be led out without a loss in conductivity of the bent wiring portion.

FIG. 22B1 is a perspective view showing the state where wiring is formed and is bent together with a substrate so that a three dimensional structure is formed, wherein a part of the substrate corresponding to the bending portion of the wiring is removed so that no loss in conductivity is caused due to the breakage or the like of the wiring.

FIG. 22B2 is a sectional view showing the state where the wiring is formed and is processed to be bent by pressing.

The method of forming the wiring is the same as in the case shown in FIGS. 22A1 and 22A2 and therefore its description is not repeated. After the wiring structure is formed, a part of the substrate corresponding to the bending portion is etched to be removed by wet etching or the like. For example, when the substrate is metal such as stainless steel, a ferric chloride solution may be used. With such a configuration, no loss in conductivity is caused due to the breakage or the like of the wiring occurring when the wiring is bent together with the surface so that the three dimensional structure is formed. In this manner, when the wiring is formed using the synthetic resin 4 and the part of the substrate corresponding to the bending portion is removed, it is possible to lead out the electrode without causing a loss in conductivity of the bent portion of the wiring, since the force added to the portion to be bent of the wiring during the bending process by pressing is dispersed.

FIG. 22C1 is a perspective view showing a state where wiring is formed and is bent together with a substrate in the opposite direction to that in the case shown in FIG. 22A1 so that a three dimensional structure is formed. FIG. 22C2 is a sectional view showing a state where the wiring is formed and is processed to be bent by pressing. The methods of forming the wiring and the three dimensional bent structure by pressing are the same as in the case shown in FIG. 22A1 and therefore their descriptions are not repeated. In this case, since the wiring structure is positioned outside the substrate 40, the wiring itself is pulled by the substrate and therefore there is a high possibility to cause a loss in conductivity. Therefore, the copper wiring formed by plating is made thicker as compared to the case where the wiring is formed inside the substrate 40. In addition, when the synthetic resin 4 used as an insulating layer also is formed to be somewhat thicker, it is possible to form the wiring on the three dimensional structure.

FIG. 22D1 is a perspective view showing the state where wiring is formed and is bent together with a substrate so that a three dimensional structure is formed, wherein a part of the substrate corresponding to the bending portion of the wiring is removed so that no loss in conductivity is caused due to the breakage or the like of the wiring.

FIG. 22D2 is a sectional view showing the state where the wiring is formed and is processed to be bent by pressing.

In order further to improve the reliability of the three dimensional wiring structure shown in FIG. 22C1, the part of the substrate 40 corresponding to the bending portion of the wiring is removed. In this manner, when the wiring is formed using the synthetic resin 4 and the part of the substrate corresponding to the bending portion is removed, it is possible to lead out the electrode without causing a loss in conductivity of the bent portion of the wiring, since the force added to the portion to be bent of the wiring during the bending process by pressing is dispersed.

Actuators of the present invention can be applied, for example, to the following uses (devices).

Those Related to Optics (1) Those having a device for deflecting light, including, for example, printers, projection displays, bar-code readers, scanners, and the like.

(2) Thin film actuated mirror arrays (3) Optical microelements: optical switching elements, focusing devices, focus adjusting mirrors, and the like.

(4) Light regulating devices: optical instruments such as cameras, video movies, endoscopes, and the like (5) Variable mirrors Pumps (6) Ink jet printers (7) Ion generators: air cleaners, humidifiers, dust collectors Motors (8) Piezoelectric linear motors, optical pick-ups, ultrasonic motors Piezo-resonators (9) Oscillation elements

(10) Discriminators

(11) Filters

Sensors

(12) Pressure sensors

(13) Acceleration sensors

(14) Impact sensors

(15) AE (Acoustic Emission) sensors

(16) Ultrasonic sensors

(17) Angular velocity sensors

(18) Gravity sensors

Mechanical Applications

(19) Microrelays

(20) Superthin membrane keyboards

(21) Fluid control valves

(22) Actuators for hard disk drives (HDD)

EXAMPLES

The present invention is described further in detail using the following specific examples.

Example 1

Figure 13C:
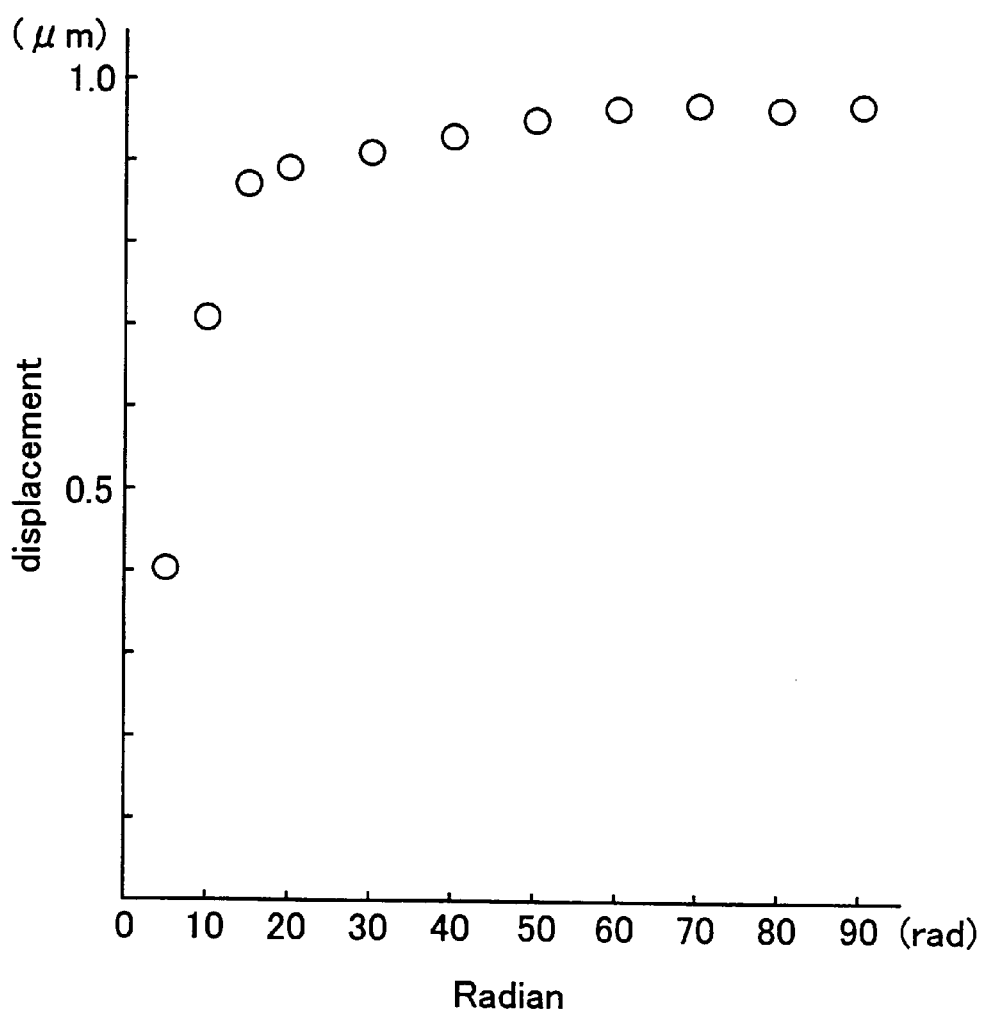
FIG. 13C is a graph showing measurement data of displacements of an actuator according to Example 1 of the present invention.

As a first experiment, the displacement of a slider provided with a head element was measured while each angle between a pair of minutely driving elements of the actuator part and a plane that is perpendicular to a disk surface and is along the longitudinal centerline of a suspension was varied. The thickness of stainless steel as a base material of the actuator was set to be 20 $\mu$m. The driving voltage was set to be constant at ±3V and the frequency to be 1 KHz. The displacement was measured by a laser doppler method. The result is shown in FIG. 13C. In this case, the disk was rotated at 1000 rpm.

The displacement hardly depends on the angle when the disk is at a standstill, but the displacement is reduced due to air viscous frictional force in the case where the angle is below 15 degrees while the disk is rotated. In view of the above results, when consideration is given to the displacement and viscosity, a suitable angle between the driving elements and the plane that is perpendicular to the disk surface and is along the longitudinal centerline of the suspension is at least about 15 degrees.

Example 2

In an actuator part, a stainless steel substrate processed in an actuator shape by etching was used.

The processed substrate was set on a substrate holder, which was placed in a chamber of a sputtering device. Then, the chamber was brought into a vacuum state (at a degree of vacuum of $2.0 \times 10^{-4}$ Pa). After it was confirmed that the substrate temperature increased to at least about 500° C., a titanium (Ti) film was formed to have a thickness of 50 nm as an adhesive layer 9, and a platinum (Pt) layer to have a thickness of about 50 to 200 nm as a layer also functioning as a lower electrode. The titanium film was used for increasing the bond strength between the substrate and the platinum film. Therefore, when the bond strength between them is high, the platinum layer may be formed directly on the substrate with the titanium film not being formed. Then, a PbLiTi film as an undercoat layer promoting the crystalline orientation of $PbZrTiO_3$ based on lead titanate of a piezoelectric thin film was formed to have a thickness of 10 to 50 nm. Afterward, the $PbZrTiO_3$ film as the piezoelectric thin film was formed to have a thickness of 2.5 $\mu$m. After it was confirmed that the substrate temperature decreased to about 100° C. or lower, a Au (gold) film as an upper electrode was formed to have a thickness of 100 to 200 nm.

Next, the substrate with the films thus formed was taken out from the vacuum chamber and a piezoelectric element was formed using a lithographic technique.

Initially, a resist to be used for processing the upper electrode was applied. The resist resin used for the processing was "S-1800" manufactured by Shipley Company. The stainless steel substrate with the films was fixed to a glass base and then the resist was applied thereto. The application method employed in this case was a spinner method. Afterward, the substrate was pre-baked in an oven at 90° C. for 15 minutes and then was taken out and was exposed to light. The exposure was carried out using a photomask. After the exposure, the substrate was dipped in a developing solution for development. After the development, the substrate was post-baked in the oven at 120° C. for 30 minutes and thus the etching resistance of the resist was improved. In the above process, the resist was patterned and then the upper electrode was processed by wet etching. A liquid mixture containing potassium iodide (KI), iodine ($I_2$), and water ($H_2O$) was used as an etchant. After the etching, the substrate was washed with pure water and then was dried. The resist resin had a thickness of about 1.0 $\mu$m. The processed state of the upper electrode was checked with an optical microscope. When no problem was found, the subsequent processing of the piezoelectric thin film was carried out.

The piezoelectric thin film was processed using buffered hydrofluoric acid. The buffered hydrofluoric acid was put in a beaker and then was warmed up to about 60° C., into which the substrate with the glass base used for the fixation thereof was immersed. The buffered hydrofluoric acid was stirred continuously so as to have a constant concentration. After the etching, the substrate was washed with pure water and then was dried. As a next step, a lower electrode was processed. The resist used for processing the upper electrode and the piezoelectric thin film was removed and a resist to be used for processing the lower electrode newly was applied. After the application of the resist, it was exposed to light using a photomask. The patterns formed in the photomask include a pattern with a one-size larger shape than that of the pattern used for the formation of the upper electrode and the piezoelectric thin film and a pattern of a lead for the lower electrode. After the exposure to light and development, the lower electrode was processed by dry etching. After the dry etching, the resist was removed and the substrate was washed. After the washing, a resist newly was applied. The resist resin used herein was "CRC-8300" manufactured by Sumitomo Bakelite Co., Ltd., which is a positive photosensitive resin containing polyimide resin. The resist was applied using a spinner. The substrate was fixed to a base with a smooth surface such as a glass base as in the case where the substrate was etched. The resist resin containing polyimide was applied to the substrate uniformly while the spinner was allowed to rotate at 3000 rpm. In this case, the back surface (on which the piezoelectric element was not formed) of the substrate was in close contact with the fixation substrate and therefore the resist resin containing polyimide was not applied to the back surface. After the application, the resist resin was exposed to light and was developed to be patterned. The pattern of the photomask had substantially the same shape as that of the processed substrate but was one-size larger than the processed substrate. Then, the substrate with the patterned resist was baked in a nitrogen atmosphere so that the resist resin was cured. The baking was carried out at 150 to 320° C. for 30 minutes using an oven with its inside air being replaced by nitrogen. The polyimide resin had a thickness of 2.0 µm.

The substrate was taken out from the oven and the processed substrate was removed. A ferric chloride solution was sprayed on the substrate to be removed, and thus the processed substrate was removed.

Thus, the piezoelectric element was transferred onto the polyimide resin of synthetic resin from the stainless steel substrate without using an adhesive or the like.

Then, in order to obtain a bent structure, the polyimide resin formed in an actuator shape was fitted into a mold to be pressed.

Afterward, a flexible substrate for wiring and minutely driving elements were electrically connected by wire bonding. Then, a slider and a base plate were combined therewith and thus a head supporting mechanism was formed.

Example 3

In an actuator part, a stainless steel substrate processed in an actuator shape by etching was used.

A lower electrode, a piezoelectric thin film, and an upper electrode were formed with a metal mask formed of stainless steel with a thickness of about 0.1 mm being set on the substrate. The processed substrate and the metal mask were set on a substrate holder, which then was placed in a chamber of a sputtering device. Then, the chamber was brought into a vacuum state. After it was confirmed that the substrate temperature increased to at least about 500° C., a titanium (Ti) film was formed to have a thickness of 50 nm as an adhesive layer 9, and a platinum (Pt) layer to have a thickness of about 50 to 200 nm as a layer also functioning as the lower electrode. The titanium film was used for increasing the bond strength between the substrate and the platinum layer. Therefore, when the bond strength between them is high, the platinum layer may be formed directly on the substrate with the titanium film not being formed. Then, a PbLiTi film as an undercoat layer promoting the crystalline orientation of $PbZrTiO_3$ based on lead titanate of the piezoelectric thin film was formed to have a thickness of 10 to 50 nm. Afterward, the $PbZrTiO_3$ film as the piezoelectric thin film was formed to have a thickness of 2.5 µm. After it was confirmed that the substrate temperature decreased to about 100° C. or lower, a Au (gold) film as the upper electrode was formed to have a thickness of 100 to 200 nm.

This film formation method using the metal mask enabled a step of processing the piezoelectric element using a lithographic technique to be omitted. The substrate was taken out from the vacuum chamber after it was confirmed that the substrate temperature decreased to an ordinary temperature. Then, the positive photosensitive resin containing polyimide resin used in Example 2 was applied using a spinner. The substrate was fixed to a base with a flat surface such as a glass base as in the case where the substrate was etched. The polyimide resin was applied to the substrate uniformly while the spinner was allowed to rotate at 3000 rpm. In this case, the back surface (on which the piezoelectric element was not formed) of the substrate was in close contact with the fixation substrate and therefore the polyimide resin was not applied to the back surface. After the application, the polyimide resin was exposed to light and was developed to be patterned. The pattern of the photomask had substantially the same shape as that of the processed substrate but was one-size larger than the processed substrate. Then, the substrate with the patterned resin was baked in a nitrogen atmosphere so that the polyimide resin was cured. The baking was carried out at 150 to 320° C. for 30 minutes using an oven with its inside air being replaced by nitrogen.

The substrate with the patterned resin was taken out from the oven and the processed substrate was removed. A ferric chloride solution was sprayed on the substrate to be removed, and thus the processed substrate was removed. The polyimide resin had a thickness of 2.0 µm.

Thus, the piezoelectric element was transferred onto the polyimide resin of synthetic resin from the stainless steel substrate without using an adhesive or the like.

Then, in order to obtain a bent structure, the polyimide resin formed in an actuator shape was fitted into a mold to be pressed. Afterward, a flexible substrate for wiring and minutely driving elements were electrically connected by wire bonding.

Then, a slider and a base plate were combined therewith and thus a head supporting mechanism was formed.

In this example, stainless steel was used for the substrate. However, the head supporting mechanism can be formed in the same manner even when using a single crystal substrate of other metals, MgO (magnesium oxide), Si (silicon), or the like.

Example 4

In an actuator part, a stainless steel substrate processed in an actuator shape by etching was used. In this example, a manufacturing method was employed in which the processed substrate was processed to be thinner. The methods of forming a piezoelectric element, applying polyimide resin and forming the actuator shape are the same as in Example 2, and therefore their descriptions are not repeated.

The difference between Example 2 and the present example is whether the whole stainless steel substrate is removed or is processed to be thinner.

After the polyimide resin formed in the actuator shape was cured, a ferric chloride solution was sprayed thereon. The thickness of the stainless steel to be removed was controlled through the control of the spraying time. After about 10 µm of the stainless steel was removed, the substrate was washed and then was dried. Next, in order to obtain a bent structure, the polyimide resin formed in an actuator shape was fitted into a mold to be pressed at an increased temperature of about 60 to 80° C. Then, it was cooled and taken out. Thus, a structure bent along the mold was formed.

Afterward, a flexible substrate for wiring and minutely driving elements were electrically connected by wire bonding.

Then, a slider and a base plate were combined therewith and thus a head supporting mechanism was formed.

In this example, stainless steel was used for the substrate. However, the head supporting mechanism can be formed in the same manner even when using a single crystal substrate of other metals, MgO (magnesium oxide), Si (silicon), or the like.

Example 5

In an actuator part, a stainless steel substrate processed in an actuator shape by etching was used. In this example, a manufacturing method was employed in which part of the processed substrate was removed. The methods of forming a piezoelectric element, applying polyimide resin and forming the actuator shape are the same as in Example 2, and therefore their descriptions are not repeated.

After the polyimide resin formed in the actuator shape was cured, polyimide resin was applied to the back surface of the substrate this time and then was patterned.

After the heating and curing of the polyimide resin, the substrate was fixed to a flat base such as a glass base with the back surface of the substrate being directed upward. Then, polyimide resin was applied to the back surface by a spinner. After the application, it was pre-baked in an oven, then was exposed to light using a photomask and was developed so that unnecessary material was removed. After the development, the polyimide resin was patterned while being applied, except the part of the substrate on the opposite side to that on which the piezoelectric element was formed, corresponding to the part where the piezoelectric element was formed. After the pattern formation, the polyimide resin was cured in a nitrogen atmosphere in an oven at an increased temperature of 150 to 320° C. for 30 minutes.

Then, the part of the stainless steel that was not covered with the polyimide resin was removed by spraying of a ferric chloride solution to be etched. This method made it possible to obtain a configuration in which the whole stainless steel of the part not covered with the polyimide resin was removed.

The thickness of the stainless steel to be removed of the part not covered with the polyimide resin can be controlled by the adjustment of the concentration of the etchant, spraying pressure, amount of etchant to be sprayed, or spraying time. Therefore, it also is possible not to remove the whole stainless steel but to leave stainless steel with an appropriate thickness.

In order to obtain a bent structure, the polyimide resin formed in an actuator shape was fitted into a mold to be pressed. Afterward, a flexible substrate for wiring and minutely driving elements were electrically connected by wire bonding.

Then, a slider and a base plate were combined therewith and thus a head supporting mechanism was formed.

In this example, stainless steel was used for the substrate. However, the head supporting mechanism can be formed in the same manner even when using a single crystal substrate of other metals, MgO (magnesium oxide), Si (silicon), or the like.

Example 6

For film formation, a MgO single crystal substrate was used. The substrate was set on a substrate holder, which was placed in a chamber in a sputtering device. Then, the chamber was brought into a vacuum state. After it was confirmed that the substrate temperature increased to at least about 500° C., a platinum (Pt) layer was formed to have a thickness of about 50 to 200 nm as a layer also functioning as a lower electrode. Then, a PbLiTi film as an undercoat layer promoting the crystalline orientation of $PbZrTiO_3$ based on lead titanate of a piezoelectric thin film was formed to have a thickness of 10 to 50 nm. Afterward, the $PbZrTiO_3$ film as the piezoelectric thin film was formed to have a thickness of $2.5\mu$. After it was confirmed that the substrate temperature decreased to about 100° C. or lower, a Au (gold) film as an upper electrode was formed to have a thickness of 100 to 200 nm.

Then, the substrate with films thus formed was taken out from the vacuum chamber, and a piezoelectric element was formed using a lithographic technique.

Initially, the resist resin used in Example 2 for processing the upper electrode was applied. Then, a resist was applied to the substrate with the films using a spinner. Afterward, it was pre-baked in an oven at 90° C. for 15 minutes, was taken out and then was exposed to light. The exposure was carried out using a photomask. After the exposure, it was immersed in a developing solution for development. After the development, it was post-baked in the oven at about 120° C. for 30 minutes and thus the etching resistance of the resist was improved. In the above process, the resist was patterned and then the upper electrode was processed by wet etching. A liquid mixture containing potassium iodide (KI), iodine ($I_2$), and water ($H_2O$) was used as an etchant. After the etching, the substrate was washed with pure water and then was dried. The state of the processed upper electrode was checked with an optical microscope. When no problem was found, the subsequent processing of the piezoelectric thin film was carried out.

The piezoelectric thin film was processed using buffered hydrofluoric acid. The buffered hydrofluoric acid was put in a beaker and then was warmed up to about 60° C., into which the substrate with the glass base used for the fixation thereof was immersed. The buffered hydrofluoric acid was stirred continuously so as to have a constant concentration. After the etching, the substrate was washed with pure water and then was dried. As a next step, the lower electrode was processed. The resist used for processing the upper electrode and the piezoelectric thin film was removed and a resist to be used for processing the lower electrode newly was applied. After the application of the resist, it was exposed to light using a photomask. The patterns formed in the photomask include a pattern with a one-size larger shape than that of the pattern used for the formation of the upper electrode and the piezoelectric thin film and a pattern of a lead for the lower electrode. After the exposure and development, the lower electrode was processed by dry etching. After the dry etching, the resist was removed and the substrate was washed. After the washing, polyimide resin was applied. Specifically, the polyimide resin was applied to the substrate uniformly using a spinner while the spinner was allowed to rotate at 3000 rpm. After the application, the polyimide resin was exposed to light and developed to be patterned. The pattern of the photomask had substantially the same shape as that of the processed substrate but was one-size larger than the processed substrate. Then, the substrate with the patterned polyimide resin was baked in a nitrogen atmosphere so that the polyimide resin was cured. The baking was carried out at 150 to 320° C. for 30 minutes using an oven with its inside air being replaced by nitrogen.

After the substrate was taken out from the oven, the whole substrate was removed by spraying of a phosphoric acid solution thereon.

Thus, the piezoelectric element was transferred onto the polyimide resin of synthetic resin from the substrate without using an adhesive or the like.

Then, in order to obtain a bent structure, the polyimide resin formed in an actuator shape was fitted into a mold to be pressed. Afterward, a flexible substrate for wiring and minutely driving elements were electrically connected by wire bonding.

Then, a slider and a base plate were combined therewith and thus a head supporting mechanism was formed.

Example 7

For film formation, a MgO single crystal substrate was used. In this example, a manufacturing method was employed in which a substrate was processed to be thinner. The methods of forming a piezoelectric element, applying polyimide resin and forming the actuator shape are the same as in Example 6, and therefore their descriptions are not repeated. The difference between Example 6 and the present example is whether the MgO substrate is removed as a whole or is processed to be thinner.

After the polyimide resin formed in the actuator shape was cured, a phosphoric acid solution was sprayed thereon. The thickness of the MgO substrate to be removed was controlled through the control of the spraying time. After the MgO substrate was removed so that about 10 $\mu$m of the substrate remained, the substrate was washed and then was dried. Next, in order to obtain a bent structure, the polyimide resin formed in an actuator shape was fitted into a mold to be pressed at an increased temperature of about 60 to 80° C. Then, it was cooled and taken out from the mold. Thus, a structure bent along the mold was formed.

Afterward, a flexible substrate for wiring and minutely driving elements were electrically connected by wire bonding. Then, a slider and a base plate were combined therewith and thus a head supporting mechanism was formed. In this example, MgO was used for the substrate. However, the head supporting mechanism can be formed in the same manner even when using a single crystal substrate of other metals, Si (silicon), or the like.

Example 8

For film formation, a MgO single crystal substrate was used. In this example, a manufacturing method was employed in which part of the substrate was removed. The methods of forming a piezoelectric element, applying polyimide resin and forming the actuator shape are the same as in Example 6, and therefore their descriptions are not repeated.

After the polyimide resin formed in the actuator shape was cured, polyimide resin was applied to the back surface of the substrate this time and then was patterned.

After the curing of the polyimide resin, the substrate was fixed to a flat base such as a glass base with the back surface of the substrate being directed upward. Then, polyimide resin was applied to the back surface by a spinner. After the application, it was pre-baked in an oven, then was exposed to light using a photomask and was developed so that unnecessary material is removed. In the pattern after the development, the polyimide resin was provided except the part of the surface on the opposite side to that on which the piezoelectric element was formed, corresponding to the part on which the piezoelectric element was formed. After the pattern formation, the polyimide resin was cured in a nitrogen atmosphere in an oven at an increased temperature of 150 to 320° C. for 30 minutes.

Then, the part of the MgO substrate that was not covered with the polyimide resin was removed by spraying of a phosphoric acid solution to be etched. This method made it possible to obtain a configuration in which the whole part of the MgO substrate not covered with the polyimide resin was removed.

The thickness of the part of the MgO substrate to be removed, which is not covered with the polyimide resin, can be controlled by the adjustment of the concentration of the etchant, spraying pressure, spraying amount, or spraying time. Therefore, it also is possible not to remove the whole but to leave the substrate with an appropriate thickness.

In order to obtain a bent structure, the polyimide resin formed in an actuator shape was fitted into a mold to be pressed. Afterward, a flexible substrate for wiring and minutely driving elements were electrically connected by wire bonding.

Then, a slider and a base plate were combined therewith and thus a head supporting mechanism was formed.

In this example, MgO was used for the substrate. However, the head supporting mechanism can be formed in the same manner even when using a single crystal substrate of other metals, Si (silicon), or the like.

Example 9

A stainless steel sheet was processed in a cantilever shape and a piezoelectric thin film with a thickness of about 2.5 $\mu$m and electrodes were formed thereon. The displacement of the cantilever was measured while the thickness of the stainless steel sheet was varied by etching. The stainless steel sheet with a thickness of 0 $\mu$m means that only polyimide resin is present. The displacement was measured by a laser doppler method. The driving voltage was set to be constant at ±3V and the frequency to be 1 KHz.

The results are shown in Table 1.

TABLE 1

| Stainless Steel Thickness ($\mu$m) | 20 | 15 | 10 | 6 | 3 | 0 |
|---|---|---|---|---|---|---|
| Displacement ($\mu$m) | 3.24 | 5.64 | 7.85 | 10.5 | 17.2 | 28.6 |

It can be seen from the above results that the stiffness tends to be lowered as the stainless steel sheet as the base material of an actuator becomes thinner, and thus the displacement is increased accordingly.

It is clear that the stiffness is lowered as the thickness of the substrate is reduced and thus a larger displacement can be obtained accordingly, irrespective of the kind of the substrate to be used.

Example 10

The displacement was measured using an actuator produced by the manufacturing method according to Example 1. In a basic configuration of the actuator, each angle between minutely driving elements and a plane that is perpendicular to a disk surface and is along the longitudinal centerline of a suspension was 60 degrees (FIG. 13B), the stainless steel used in this example had a thickness of 20 $\mu$m, the piezoelectric thin film a thickness of 2.5 $\mu$m, and the synthetic resin a thickness of 10 $\mu$m.

The actuator was a type including a pair of minutely driving elements placed in an actuator part shown in FIGS. 15A and 15B in which all the parts were replaced by synthetic resin. The driving voltage was set to be constant at ±3V and the frequency to be 1 KHz. The displacement was measured by a laser doppler method. In this case, the disk was allowed to rotate at 12000 rpm. For comparison, a stainless-based actuator with the same shape also was produced without using synthetic resin and displacement in the stainless-based actuator was measured. In the actuator formed using synthetic resin, the displacement was about 4.4 times as large as that in the stainless-based actuator.

From this experiment, it was confirmed that the displacement could be increased considerably through the replacement of the stainless steel by synthetic resin.

Example 11

The displacement was measured using an actuator produced by the manufacturing method according to Example 3. In a basic configuration of the actuator, each angle between minutely driving elements and a plane that is perpendicular to a disk surface and is along the longitudinal centerline of a suspension was 60 degrees, the stainless steel used in this example had a thickness of 20 $\mu$m, the piezoelectric thin film a thickness of 2.5 $\mu$m, and the synthetic resin a thickness of 10 $\mu$m.

Figure 16B:
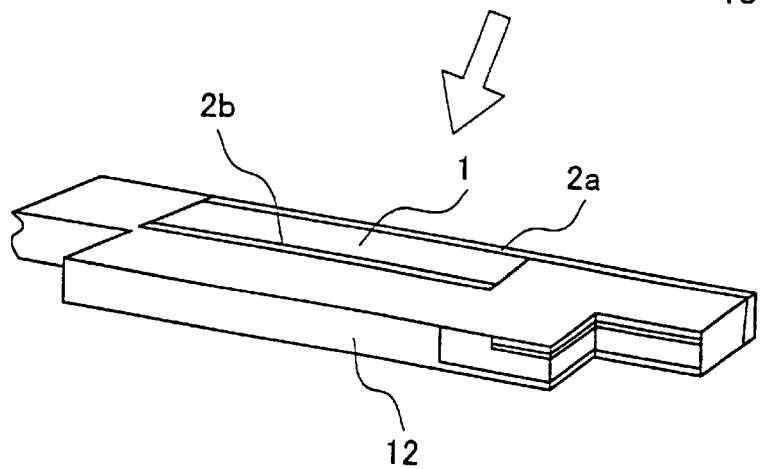
FIG. 16B is a partially enlarged view showing the portion circled in FIG. 16A.

The actuator was a type including a pair of minutely driving elements placed in an actuator part shown in FIGS. 16A and 16B in which part (a shape maintaining sheet of the piezoelectric element) of the actuator part was replaced by synthetic resin. The driving voltage was set to be constant at ±3V and the frequency to be 1 KHz. The displacement was measured by a laser doppler method. In this case, the disk was allowed to rotate at 12000 rpm. For comparison, a stainless-based actuator with the same shape also was produced without using synthetic resin and displacement in the stainless-based actuator was measured. In the actuator formed using synthetic resin, the displacement was about 4.5 times as large as that in the stainless-based actuator.

From this experiment, it was confirmed that the displacement could be increased considerably through the replacement of the stainless steel by synthetic resin.

Example 12

The displacement was measured using an actuator produced by the manufacturing method according to Example 4. In a basic configuration of the actuator, each angle between minutely driving elements and a plane that is perpendicular to a disk surface and is along the longitudinal centerline of a suspension was 60 degrees, the stainless steel used in this example had a thickness of 20 $\mu$m, the piezoelectric thin film a thickness of 2.5 $\mu$m, and the synthetic resin a thickness of 5$\mu$.

The actuator was a type including a pair of minutely driving elements placed in an actuator part shown in FIGS. 17A and 17B in which the stainless steel substrate was covered partially with synthetic resin and was etched as a whole to be thinner. The driving voltage was set to be constant at ±3V and the frequency to be 1 KHz. The displacement was measured by a laser doppler method. In this case, the disk was allowed to rotate at 12000 rpm. For comparison, a stainless-based actuator with the same shape also was produced without using synthetic resin and displacement in the stainless-based actuator was measured. In the actuator formed using synthetic resin, the displacement was about 3.1 times as large as that in the stainless-based actuator.

From this experiment, it was confirmed that the displacement could be increased considerably when the stainless steel substrate was covered partially with the synthetic resin and was processed to be thinner.

Example 13

The displacement was measured using an actuator produced by the manufacturing method according to Example 4. In a basic configuration of the actuator, each angle between minutely driving elements and a plane that is perpendicular to a disk surface and is along the longitudinal centerline of a suspension was 60 degrees, the stainless steel used in this example had a thickness of 20 $\mu$m, the piezoelectric thin film a thickness of 2.5 $\mu$m, and the synthetic resin a thickness of 5 $\mu$m.

The actuator was a type including a pair of minutely driving elements placed in an actuator part shown in FIGS. 17A and 17B in which part (the shape maintaining sheet on the piezoelectric element) of the stainless steel substrate was covered with synthetic resin and was etched to be thinner. The driving voltage was set to be constant at ±3V and the frequency to be 1 KHz. The displacement was measured by a laser doppler method. In this case, the disk was allowed to rotate at 12000 rpm. For comparison, a stainless-based actuator with the same shape also was produced without using synthetic resin and displacement in the stainless-based actuator was measured. In the actuator formed using synthetic resin, the displacement was about three times as large as that in the stainless-based actuator.

From this experiment, it was confirmed that the displacement could be increased considerably when a part (the shape maintaining sheet on the piezoelectric element) of the stainless steel substrate was covered with the synthetic resin and was processed to be thinner.

Example 14

The displacement was measured using an actuator produced by the manufacturing method according to Example 5. In a basic configuration of the actuator, each angle between minutely driving elements and a plane that is perpendicular to a disk surface and is along the longitudinal centerline of a suspension was 60 degrees, the MgO single crystal substrate was used, the piezoelectric thin film had a thickness of 2.5 $\mu$m, and the synthetic resin a thickness of 10 $\mu$m.

The actuator was a type including a pair of minutely driving elements placed in an actuator part shown in FIGS. 15A and 15B in which all the parts were replaced by synthetic resin. The driving voltage was set to be constant at ±3V and the frequency to be 1 KHz. The displacement was measured by a laser doppler method. In this case, the disk was allowed to rotate at 12000 rpm. For comparison, a stainless-based actuator with the same shape also was produced without using synthetic resin and displacement in the stainless-based actuator was measured. In the actuator formed using synthetic resin, the displacement was about 8.1 times as large as that in the stainless-based actuator. The increase in the displacement results from the multiplier effect of the increase in the displacement by about four times due to the replacement of the stainless steel by synthetic resin and of the improvement in characteristics of a piezoelectric constant $d_{31}$ of the piezoelectric thin film, which grew epitaxially on the single crystal substrate, by twice.

From this experiment, it was confirmed that the displacement could be increased considerably through the replacement of the whole by synthetic resin.

Example 15

The displacement was measured using an actuator produced by the manufacturing method according to Example 5. In a basic configuration of the actuator, each angle between minutely driving elements and a plane that is perpendicular to a disk surface and is along the longitudinal centerline of a suspension was 60 degrees, a MgO single crystal substrate was used, the piezoelectric thin film had a thickness of 2.5 μm, and the synthetic resin a thickness of 10 μm.

The actuator was a type including a pair of minutely driving elements placed in an actuator part shown in FIGS. 16A and 16B in which part of the actuator part was covered with and was replaced by synthetic resin. The driving voltage was set to be constant at ±3V and the frequency to be 1 KHz. The displacement was measured by a laser doppler method. In this case, the disk was allowed to rotate at 12000 rpm. For comparison, a stainless-based actuator with the same shape also was produced without using synthetic resin and displacement in the stainless-based actuator was measured. In the actuator formed using synthetic resin, the displacement was about 7.8 times as large as that in the stainless-based actuator. The increase in the displacement results from the multiplier effect of the increase in the displacement by about four times due to the replacement of the stainless steel by synthetic resin and of the improvement in characteristics of a piezoelectric constant d31 of the piezoelectric thin film, which grew epitaxially on the single crystal substrate, by twice.

From this experiment, it was confirmed that the displacement could be increased considerably through the replacement of the MgO by synthetic resin.

Example 16

The wiring structure shown in FIGS. 22A1 and 22A2 was produced and how the electrical characteristics of a piezoelectric element changed before and after the bending process by pressing was studied. The structure of the piezoelectric element was Ti/Pt/PLT/PLT/Pt. The films of the piezoelectric element were formed on stainless steel. For the film formation, a metal mask was used and therefore the piezoelectric element was not required to be processed. The lower electrode was led out through the stainless steel, and for the upper electrode, copper wiring was formed by plating using polyimide resin as a base insulating layer and then the polyimide resin as a cover layer was patterned. Using a LCR meter, inductance L, capacitance C, and impedance Z were measured at a frequency of 1 KHz. The results are shown in Table 2.

TABLE 2

|  | Before Bending Process | After Bending Process |
| --- | --- | --- |
| Impedance Z | 0.627 M ohm | 0.628 M ohm |
| Inductance L | −99.8 H | −99.9 H |
| Capacitance C | 0.2543 nF | 0.2535 nF |

Viewed from the above results, it was confirmed that the three dimensional wiring structure could be obtained while having the same electrical characteristics after the bending process as before the bending process.

Example 17

The wiring structure shown in FIGS. 22B1 and 22B2 was produced and how the electrical characteristics of a piezoelectric element changed before and after the bending process by pressing was studied. The structure of the piezoelectric element was Ti/Pt/PLT/PLT/Pt. The films of the piezoelectric element were formed on stainless steel. For the film formation, a metal mask was used and therefore the piezoelectric element was not required to be processed. The lower electrode was led out through the stainless steel, and for the upper electrode, copper wiring was formed by plating using polyimide resin as a base insulating layer and then the polyimide resin as a cover layer was patterned. Eventually, a part to be bent of the stainless steel was removed by etching with a ferric chloride solution. Using a LCR meter, inductance L, capacitance C, and impedance Z were measured at a frequency of 1 KHz. The results are shown in Table 3.

TABLE 3

|  | Before Bending Process | After Bending Process |
| --- | --- | --- |
| Impedance Z | 0.611 M ohm | 0.620 M ohm |
| Inductance L | −98.8 H | −97.9 H |
| Capacitance C | 0.2533 nF | 0.2545 nF |

Viewed from the above results, it was confirmed that the three dimensional wiring structure could be obtained while having the same electrical characteristics after the bending process as before the bending process. In addition, when the yield after the bending was compared in the cases where the part of the stainless steel to be bent as the substrate was removed and was not removed, a slightly better result was obtained in the case where the part was removed.

Example 18

The wiring structure shown in FIGS. 22C1 and 22C2 was produced and how the electrical characteristics of a piezoelectric element changed before and after the bending process by pressing was studied. The structure of the piezoelectric element was Ti/Pt/PLT/PLT/Pt. The films of the piezoelectric element were formed on stainless steel. For the film formation, a metal mask was used and therefore the piezoelectric element was not required to be processed. The lower electrode was led out through the stainless steel, and for the upper electrode, copper wiring was formed by plating using polyimide resin as a base insulating layer and then the polyimide resin as a cover layer was patterned. Using a LCR meter, inductance L, capacitance C, and impedance Z were measured at a frequency of 1 KHz. The results are shown in Table 4.

TABLE 4

|  | Before Bending Process | After Bending Process |
| --- | --- | --- |
| Impedance Z | 0.612 M ohm | 0.635 M ohm |
| Inductance L | −97.8 H | −97.9 H |
| Capacitance C | 0.2543 nF | 0.2575 nF |

Viewed from the above results, it was confirmed that the three dimensional wiring structure could be obtained while having the same electrical characteristics after the bending process as before the bending process.

Example 19

The wiring structure shown in FIGS. 22D1 and 22D2 was produced and how the electrical characteristics of a piezoelectric element changed before and after the bending process by pressing was studied. The structure of the piezoelectric element was Ti/Pt/PLT/PLT/Pt. The films of the piezoelectric element were formed on stainless steel. For the film formation, a metal mask was used and therefore the piezoelectric element was not required to be processed. The lower electrode was led out through the stainless steel and for the upper electrode, copper wiring was formed by plating using polyimide resin as a base insulating layer and then the polyimide resin as a cover layer was patterned. Eventually, a part of the stainless steel to be bent was removed by etching with a ferric chloride solution. Using a LCR meter, inductance L, capacitance C, and impedance Z were measured at a frequency of 1 KHz. The results are shown in Table 5.

TABLE 5

|  | Before Bending Process | After Bending Process |
| --- | --- | --- |
| Impedance Z | 0.632 M ohm | 0.655 M ohm |
| Inductance L | −99.9 H | −98.9 H |
| Capacitance C | 0.2553 nF | 0.2585 nF |

Viewed from the above results, it was confirmed that the three dimensional wiring structure could be obtained while having the same electrical characteristics after the bending process as before the bending process. In addition, when the yield after the bending was compared in the cases where the part of the stainless steel to be bent as the substrate was removed and was not removed, a slightly better result was obtained in the case where the part was removed.

Example 20

The wiring structures shown in FIGS. 23A1, 23B1, 23C1 and 23D1 were produced and how the electrical characteristics of the piezoelectric element changed before and after the bending process by pressing was studied. The structure of each piezoelectric element was Ti/Pt/PLT/PLT/Pt. The films of the piezoelectric element were formed on stainless steel. For the film formation, a metal mask was used and therefore the piezoelectric element was not required to be processed. On the stainless steel, a polyimide layer was formed as an insulating layer, and for the upper and lower electrodes, copper wiring was formed by plating using polyimide resin as a base insulating layer and then the polyimide resin as the cover layer was patterned. Thus, the respective electrodes were led out to the upper electrode side. The wiring structures were produced with a part of the stainless steel to be bent in the bending process by pressing being removed by etching with a ferric chloride solution and with the part not being removed. Using a LCR meter, inductance L, capacitance C, and impedance Z were measured at a frequency of 1 KHz. The results are shown in Tables 6 to 9.

TABLE 6

FIG. 23A1

|  | Before Bending Process | After Bending Process |
| --- | --- | --- |
| Impedance Z | 0.732 M ohm | 0.745 M ohm |
| Inductance L | −100.9 H | −100.9 H |
| Capacitance C | 0.2543 nF | 0.2575 nF |

TABLE 7

FIG. 23B1

|  | Before Bending Process | After Bending Process |
| --- | --- | --- |
| Impedance Z | 0.722 M ohm | 0.715 M ohm |
| Inductance L | −99.9 H | −99.9 H |
| Capacitance C | 0.2523 nF | 0.2515 nF |

TABLE 8

FIG. 23C1

|  | Before Bending Process | After Bending Process |
| --- | --- | --- |
| Impedance Z | 0.752 M ohm | 0.733 M ohm |
| Inductance L | −99.5 H | −98.9 H |
| Capacitance C | 0.2574 nF | 0.2565 nF |

TABLE 9

FIG. 23D1

|  | Before Bending Process | After Bending Process |
| --- | --- | --- |
| Impedance Z | 0.745 M ohm | 0.744 M ohm |
| Inductance L | −100.9 H | −99.9 H |
| Capacitance C | 0.2573 nF | 0.2575 nF |

Viewed from the above results, excellent results were obtained in the structures shown in FIGS. 23A1 to 23D1, in which the electrical characteristics hardly changed before and after the bending process by pressing. Therefore, the use of the wiring structures using synthetic resin enables three dimensional wiring structures to be obtained.

According to the present invention, a piezoelectric element can be formed using no adhesive and furthermore, the size of the element can be reduced to be minute, and the piezoelectric element can be designed without constraint. In addition, a considerably larger displacement can be obtained as compared to that in a conventional piezoelectric element. Particularly, when the actuator of the present invention is used as one for a magnetic head or the like, an actuator and information recording/reproducing device can be obtained, which can be controlled with high precision. When resonance frequency is low and a high speed control is difficult, size reduction is required. In the actuator of the present invention, even when its size is reduced, the displacement and voltage (i.e. efficiency) can be drawn out efficiently. Furthermore, the reduction in film thickness also enables power consumption to be reduced.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An actuator, comprising:
   a shape maintaining sheet;
   a piezoelectric member provided integrally on the shape maintaining sheet, the piezoelectric member having a surface and a plurality of side faces; and
   a pair of electrodes formed to sandwich the piezoelectric member, wherein the shape maintaining sheet is formed of synthetic resin, and the resin covers the surface of the piezoelectric member and at least a portion of at least one of the plurality of side faces of the piezoelectric member.

2. The actuator according to claim 1, wherein the piezoelectric member is formed of thin films with a thickness in a range between 1.0 and 5.0 µm, and the actuator is driven using flexure of the piezoelectric member in a thickness direction.

3. The actuator according to claim 1, wherein the synthetic resin is a photoresist with a thickness in a range between 1.0 and 10.0 µm.

4. The actuator according to claim 1, wherein the synthetic resin is at least one resin selected from positive photosensitive resin containing polyimide resin and polybenzoxazole resin.

5. The actuator according to claim 1, wherein the synthetic resin is used as an electrical insulating layer.

6. The actuator according to claim 1, wherein the synthetic resin is an electrical insulating layer for a driving wire used for driving the actuator or a signal wire for transmitting a signal.

7. The actuator according to claim 1, wherein a driving wire of the actuator is led out while having at least one portion bent with respect to a plane in which the actuator is formed.

8. The actuator according to claim 7, wherein at least part of a substrate on which the driving wire is formed is removed by etching.

9. The actuator according to claim 7, wherein the driving wire is defined by at least synthetic resin of an electrical insulating layer, copper, and synthetic resin of a cover layer.

10. The actuator according to claim 7, wherein the driving wire comprises copper as a main component and its surface is covered with synthetic resin as an electrical insulating layer.

11. The actuator according to claim 10, wherein the driving wire comprising copper as a main component is formed by plating.

12. The actuator according to claim 1, further comprising a substrate under synthetic resin, wherein the synthetic resin is used as the shape maintaining sheet and a protective layer for protecting the piezoelectric member.

13. The actuator according to claim 1, further comprising a reinforcer added to the synthetic resin for increasing mechanical strength.

14. The actuator according to claim 1, wherein the shape maintaining sheet and the piezoelectric member are formed integrally by application of resin to form the shape maintaining sheet to a surface of the piezoelectric member and baking thereof.

15. An information recording/reproducing device including an actuator, comprising:
a slider on which a head is mounted;
a head supporting mechanism for supporting the head through the slider; and
a tracking member for allowing tracking by the head through the head supporting mechanism,
wherein the actuator includes:
a shape maintaining sheet;
a piezoelectric member provided integrally on the shape maintaining sheet, the piezoelectric member having a surface and a plurality of side faces; and
a pair of electrodes formed to sandwich the piezoelectric member,
the shape maintaining sheet being formed of synthetic resin, the resin covering the surface of the piezoelectric member and at least a portion of at least one of the plurality of side faces of the piezoelectric member,
the head supporting mechanism includes the actuator, and
the actuator is driven to displace the head minutely.

16. The information recording/reproducing device according to claim 15, wherein a direction in which the actuator is driven mainly is a direction parallel to a disk surface.

* * * * *